(12) United States Patent
Melman et al.

(10) Patent No.: US 10,056,530 B1
(45) Date of Patent: Aug. 21, 2018

(54) PHOSPHOR-CONVERTED WHITE LIGHT EMITTING DIODES HAVING NARROW-BAND GREEN PHOSPHORS

(71) Applicant: EIE MATERIALS, INC., Lexington, KY (US)

(72) Inventors: Jonathan Melman, Lexington, KY (US); Robert Nordsell, Lexington, KY (US); Kristen Baroudi, Lexington, KY (US); Evan Thomas, Lexington, KY (US); Yong Bok Go, Lexington, KY (US)

(73) Assignee: EIE MATERIALS, INC., Lexington, KY (US)

( * ) Notice: Subject to any disclaimer, the term of this patent is extended or adjusted under 35 U.S.C. 154(b) by 0 days.

(21) Appl. No.: 15/679,021

(22) Filed: Aug. 16, 2017

Related U.S. Application Data

(60) Provisional application No. 62/539,233, filed on Jul. 31, 2017.

(51) Int. Cl.
*H01L 33/00* (2010.01)
*H01L 33/50* (2010.01)

(52) U.S. Cl.
CPC ............ *H01L 33/504* (2013.01); *H01L 33/50* (2013.01); *H01L 33/502* (2013.01); *H01L 2224/73265* (2013.01); *H01L 2933/0041* (2013.01)

(58) Field of Classification Search
CPC ..... H01L 33/50; H01L 33/502; H01L 33/504; H01L 2224/73265; H01L 2933/0041
See application file for complete search history.

(56) References Cited

U.S. PATENT DOCUMENTS

| | | |
|---|---|---|
| 3,639,254 A | 2/1972 | Peters |
| 3,801,702 A | 4/1974 | Donohue |
| 4,441,046 A | 4/1984 | James |
| 5,747,929 A | 5/1998 | Kato et al. |
| 6,417,019 B1 | 7/2002 | Mueller et al. |
| 6,597,108 B2 | 7/2003 | Yano et al. |
| 6,614,173 B2 | 9/2003 | Yano et al. |

(Continued)

OTHER PUBLICATIONS

Ruijin Yu et al., "Luminescence properties of stoichionmetric EuM2S4 (M=Ga, Al) conversion phosphors for white LED applications", Phys. Status Solidi A, May 31, 2012, pp. 1-6, DOI 10.1002/pssa.201228348, Wiley Online Library.

(Continued)

*Primary Examiner* — Zandra Smith
*Assistant Examiner* — John M Parker
(74) *Attorney, Agent, or Firm* — Innovation Counsel LLP

(57) ABSTRACT

In one aspect, a phosphor converted white light LED comprising a narrow green phosphor rather than a conventional broad green phosphor may simultaneously exhibit high R9, and high Luminance Efficacy of Radiation, optionally without use of a deep red phosphor to maintain desired red color rendering. In another aspect, a phosphor converted white light LED comprising a narrow green phosphor rather than a conventional broad green phosphor may provide an emission spectrum exhibiting a significant dip in the yellow region of the spectrum and thereby provide high red-green contrast without use of a filter. The yellow dip may be shallower than in conventional devices, and the device may therefore be brighter, while maintaining desired CRI and R9.

30 Claims, 11 Drawing Sheets

(56) References Cited

U.S. PATENT DOCUMENTS

| | | |
|---|---|---|
| 6,627,251 B2 | 9/2003 | Yano et al. |
| 6,773,629 B2 | 8/2004 | Le Mercier et al. |
| 6,926,848 B2 | 8/2005 | Le Mercier et al. |
| 7,005,198 B2 | 2/2006 | Yano et al. |
| 7,018,565 B2 | 3/2006 | Tian et al. |
| 7,125,501 B2 | 10/2006 | Tian et al. |
| 7,368,179 B2 | 5/2008 | Tian et al. |
| 7,427,366 B2 | 9/2008 | Tian et al. |
| 7,453,195 B2 | 11/2008 | Radkov |
| 7,497,973 B2 | 3/2009 | Radkov et al. |
| 7,651,631 B2 | 1/2010 | Igarashi et al. |
| 7,768,189 B2 | 8/2010 | Radkov |
| 7,816,862 B2 * | 10/2010 | Noguchi ............... C09K 11/584 252/301.6 S |
| 8,921,875 B2 | 12/2014 | Letoquin et al. |
| 9,219,201 B1 | 12/2015 | Todorov et al. |
| 9,243,777 B2 | 1/2016 | Donofrio et al. |
| 9,496,464 B2 | 11/2016 | Yao et al. |
| 9,530,944 B2 | 12/2016 | Jacobson et al. |
| 9,607,821 B2 | 3/2017 | Levin et al. |
| 2003/0042845 A1* | 3/2003 | Pires ................ G02F 1/133617 313/501 |
| 2007/0284563 A1* | 12/2007 | Lee ..................... H01L 25/0753 257/13 |
| 2013/0114242 A1* | 5/2013 | Pickard ..................... F21V 9/16 362/84 |
| 2013/0313516 A1* | 11/2013 | David ..................... H01L 33/50 257/13 |
| 2014/0077689 A1* | 3/2014 | Thompson ............. C09K 11/06 313/504 |
| 2014/0307417 A1* | 10/2014 | Yamakawa ............... F21V 3/04 362/84 |
| 2014/0321099 A1* | 10/2014 | Kaide ................ C09K 11/7792 362/84 |
| 2016/0009990 A1* | 1/2016 | Yoo ..................... C09K 11/7734 257/98 |
| 2016/0223146 A1 | 8/2016 | Vick et al. |

OTHER PUBLICATIONS

K.T. Le Thi, et al., "Investigation of the MS—Al2S3 systems (M = Ca, Sr, Ba) and luminescence properties of europium-doped thioaluminates", Materials Science and Engineering, B14 (1992) pp. 393-397.

P.C. Donohue, et al., "The Synthesis and Photoluminescence of MiiM2iii(S,Se)4", J. Electrochem. Soc. 1974, vol. 121, Issue 1, pp. 137-142.

A.G. Paulusz, "Efficient Mn(IV) Emission in Fluorine Coordination", J. Electrochem. Soc.: Solid-State Science and Technology, Jul. 1973, pp. 942-947.

Zhang, et al., "Robust and Stable Narrow-Band Green Emitter: An Option for Advanced Wide-Color-Gamut Backlight Display", CM Chemistry of Materials, Chem. Mater. 2016, 28, pp. 8493-8497.

* cited by examiner

PHOSPHOR-CONVERTED WHITE LIGHT EMITTING DIODES HAVING NARROW-BAND GREEN PHOSPHORS

CROSS REFERENCE TO RELATED APPLICATIONS

This application claims benefit of priority to U.S. Provisional Patent Application No. 62/539,233 titled "Phosphor-Converted White Light Emitting Diodes Having Narrow Band Green Phosphors" and filed Jul. 31, 2017, which is incorporated herein by reference in its entirety.

This application also incorporates by reference in its entirety U.S. patent application Ser. No. 15/591,629 titled "Phosphors With Narrow Green Emission" and filed May 10, 2017.

STATEMENT OF GOVERNMENT SUPPORT

This invention was made with federal government support from the National Science Foundation under award number 1534771 and the Department of Energy under award number DE-EE0007622. The federal government has certain rights in the invention. This invention was also made with support from the Kentucky Cabinet for Economic Development, Office of Entrepreneurship, under Grant Agreement KSTC-184-512-17-247 with the Kentucky Science and Technology Corporation.

FIELD OF THE INVENTION

The invention relates generally to phosphor-converted white light emitting diodes comprising narrow-band green phosphors.

BACKGROUND

The ability of a light source to render deep red colors is measured by the metric R9. Unfiltered incandescent light sources by definition render those extremely well, typically greater than 97. Replacements for incandescent light sources have tended to struggle with faithful rendition of red colors. For example high pressure sodium lamps and older fluorescent lighting tubes often had negative values for R9, and reduced almost any red color to a rather dull orange appearance. Early light emitting diodes (LEDs) were notorious for poor rendering of red colors. The situation was so significant that many programs related to LED lighting only require R9>0. This contrasts with the requirements for the general color rendering index (CRI) which are usually CRI>80.

Generally speaking, general lighting can be made more pleasing by the increase of red-green contrast, for example by the removal of yellow light, which can wash out the appearance of many objects. This phenomenon has been known in the art for many years, dating back at least to U.S. Pat. No. 4,441,046 "Incandescent lamps with neodymium oxide vitreous coatings", in which a neodymium oxide coating filters out some of the green and lot of the yellow. Based on this work, in 1995 GE released the Enrich® line of incandescent light bulbs, and in 2001 renamed the line Reveal®. The incandescent Reveal® product line still exists today, along with an updated Reveal® LED product, still utilizing a neodymium based filter.

FIG. 1 shows normalized emission spectra of a Reveal® incandescent bulb (solid line) and of a Reveal® A19 LED bulb (dashed line), showing the effect of the neodymium oxide filters in these products. One of the largest drawbacks of this methodology is that it first creates photons and then removes a significant portion of the photons which have been created. This can be seen in the rated outputs of a 60 W Reveal® incandescent, 520 lumens, and Reveal® LED A19, 570 lumens, compared with the benchmark 800 lumens for a 60 W equivalent A19.

Generally, it has been an industry goal to produce white light emitting phosphor-converted LEDs that have emission spectra that are relatively flat, sloped, and continuous in the region between about 500 nanometers (nm) and about 600 nm. This general shape roughly mirrors the reference illuminant, e.g. the emission spectra of black body radiators such as a standard incandescent. As shown in FIG. 1, the neodymium oxide filter used in the Reveal® products introduces a dip in the emission spectra in the yellow region. Such a dip may be characterized by the residual intensity at its minimum when compared to the maximum intensity of the emission spectrum between 400 nm and 700 nm, for example about 25% for the incandescent version and about 33% for the LED A19 version.

Red-green contrast does not have a clear metric in the CRI/Ra system, however it can be captured to some extent by the gamut index metric (Rg) of the IES TM-30-15 method. Applicant measured an Rg of 109 for the Reveal® incandescent versus 101 for a non-filtered incandescent. The Reveal® LED bulb similarly measures at a high Rg value of 104. Surprisingly, despite the good gamut indices, these bulbs measure relatively poorly on the R9 deep red metric. A drawback of this method is that the neodymium filter used subtracts a significant amount of the light generated. Photons in the wavelength region impacted by these neodymium filters are especially particularly bright, typically ranging from 512 to 625 lumens per optical Watt compared with the maximum of 683 lumens per optical Watt. The Reveal® LED bulb is rated to deliver 570 lumens using 10.5 W, while a similar Correlated Color Temperature (CCT) and CRI LED bulb from the Relax® line delivers 800 lumens using those same 10.5 W.

Typically, white light emitting phosphor-converted LEDs comprise a two or sometimes three phosphor blend, with a combination of a broad green or yellow phosphor having a full width at half maximum (FWHM) of about 60-100 nm and a peak wavelength of about 500-570 nm and a broad red phosphor having a FWHM of about 70-100 nm and a peak wavelength of about 615-670 nm, or more usually about 625-650 nm.

A red phosphor with peak emission at 625-630 nm provides higher efficacy, due to the better overlap of the red phosphor emission and the photopic response curve of the typical human eye, but this choice of red phosphor emission is generally to the detriment of R9. Conversely, a red phosphor with a peak emission closer to 650 nm provides better red rendering, however, but at a cost of efficacy because the longer wavelength red emission contributes little to the overall brightness of the LED. There is generally an inverse relation between the deep red rendering of a light source as measured by R9 and the spectral efficiency or luminous efficacy of radiation (LER) of the spectrum.

SUMMARY

In one aspect of the invention, Applicants have discovered that phosphor converted white light LEDs comprising a narrow green phosphor rather than a conventional broad green phosphor may simultaneously exhibit high R9, high CRI, and high Luminance Efficacy of Radiation without use of a deep red phosphor to maintain desired red color rendering. For example, in such devices the longest wavelength phosphor peak emission may be shorter than about 635 nm.

In another aspect, Applicants have discovered that phosphor converted white light LEDs comprising a narrow green phosphor rather than a conventional broad green phosphor may provide an emission spectrum exhibiting a significant dip in the yellow region of the spectrum and thereby provide high red-green contrast without use of a filter. Because this yellow dip is in the light emission, rather than caused by a filter, no emission power is lost to filtering. Further, Applicant has discovered that with use of narrow green phosphors the yellow dip may be shallower than in prior art products, and the device may therefore be brighter, while maintaining desired CRI and R9 (red color rendering). The minimum intensity in the yellow dip may be, for example, greater than about 25% of the peak intensity in the total emission spectrum of the device between about 400 nm and about 700 nm.

These and other embodiments, features and advantages of the present invention will become more apparent to those skilled in the art when taken with reference to the following more detailed description of the invention in conjunction with the accompanying drawings that are first briefly described.

DETAILED DESCRIPTION

Figure 1:
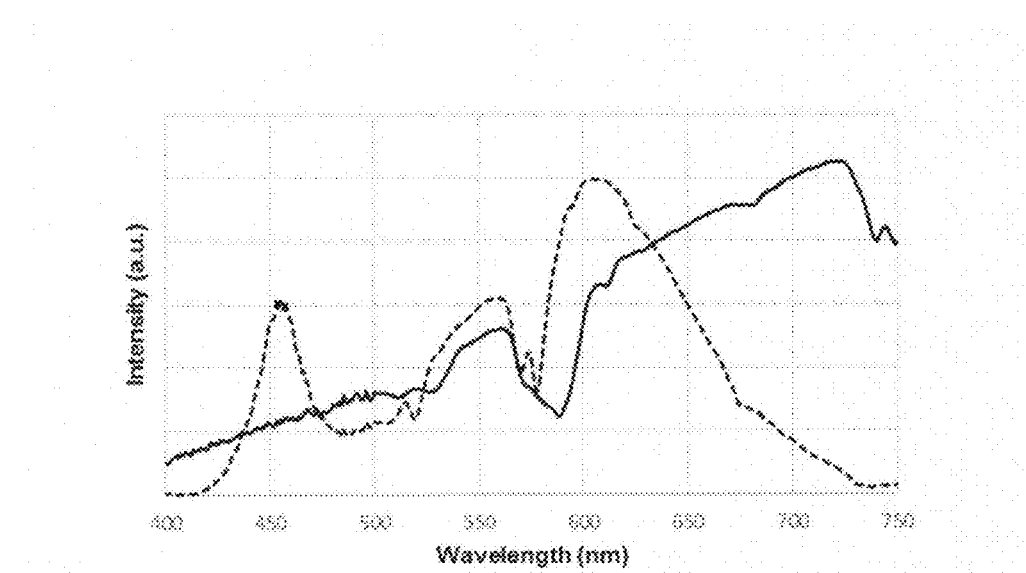
FIG. 1 shows normalized emission spectra of a Reveal® incandescent bulb (solid line) and of a Reveal® A19 LED bulb (dashed line).

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention. As used in this specification and in the claims, the term LED is intended to include light emitting diodes and semiconductor laser diodes.

Applicants have developed new families of phosphors that may be excited by a blue emitting LED and in response emit narrow band green light. These phosphors generally emit at a peak wavelength of about 500 nm to about 550 nm, with the peak having a FWHM of about 30 nm to about 50 nm. Examples of these phosphors are described later in this specification and also in U.S. patent application Ser. No. 15/591,629 titled "Phosphors With Narrow Green Emission" referred to above.

In addition, Applicants have simulated total emission spectra from white light emitting phosphor-converted LEDs comprising a blue LED, a green phosphor excited by the blue LED, and a red phosphor excited by the blue LED. In these simulations, the blue LED has a peak emission at about 455 nm with a FWHM of about 20 nm. The green phosphor has a peak emission at about 500 nm to about 550 nm with a FWHM of about 30 nm to about 50 nm (as do various of Applicants' new narrow green phosphors); in some cases the green phosphor may be a blend of 2 or more slightly different phosphors. In some simulations, the red phosphor has a peak emission at about 630 nm with a FWHM of about 90 nm, generally corresponding to emission from Intematix Corporation ER6436 red phosphor or Mitsubishi Chemical BR-102C. In other simulations, the red phosphor has a peak emission at about 626 nm with a FWHM of about 80 nm, generally corresponding to emission from Mitsubishi Chemical Corporation BR-102/Q red phosphor. No other light sources (e.g., no additional LEDs or additional phosphors) contribute to the total emission from the simulated devices. However, white light-emitting phosphor converted LEDs as described in this specification may in some embodiments optionally comprise additional phosphors, for example additional green emitting phosphors and/or additional red emitting phosphors.

In these simulations, the red phosphor peak and bandwidth were held constant, the LED emission peak and bandwidth were held constant, the green phosphor emission peak and bandwidth were varied, the ratio of green phosphor emission intensity to blue LED emission intensity was varied, and the ratio of red phosphor emission intensity to blue LED emission intensity was varied. (Varying the ratios of green and red phosphor emission intensity to blue LED emission intensity is analogous to varying phosphor concentration and loading in a phosphor-converted LED).

The simulated spectra were characterized by calculating various parameters including for example CCT, Duv (distance in a CIE chromaticity diagram from the Planckian locus), CRI, R9, R11, LER, and the intensity at the minimum of a dip (depression) in the yellow region (e.g., about 550 nm to about 580 nm) of the spectrum measured as a percentage of the maximum intensity in the emission spectrum in the range from about 400 nm to about 700 nm.

Some exemplary results of these simulations and some related measurements are presented below.

CCT 2700 K

Table 1A below characterizes three simulated spectra for a white light emitting phosphor converted LED comprising a blue LED, an ER6436 red phosphor, and a green phosphor having peak emission at 524 nm, 528 nm, or 534 nm and a FWHM of 35 nm. The CCT for these spectra is between 2600 K and 2850 K, nominally 2700 K, and the CRI is greater than 90.

TABLE 1A 2700K, green phosphor FWHM of 35 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 524 nm (35 nm) | 91 | 0.002 | 106 | 94 | 67 | 290 | 37% (563 nm) |
| 528 nm (35 nm) | 94 | 0.003 | 105 | 80 | 80 | 294 | 40% (560 nm) |
| 534 nm (35 nm) | 90 | 0.005 | 103 | 66 | 92 | 304 | 47% (566 nm) |

The trend with green phosphors of 35 nm FWHM combined with a red phosphor with about 90 nm FWHM seems to be that R11 has a maximum at a phosphor wavelength of 534 nm. R11 values then decrease as peak wavelength decreases. The R9 value trend is very dependent upon not just green phosphor peak wavelength, but also CCT and duv. For this particular combination of CCT and CRI, R9 appears to show a relative maximum with the 522-524 nm phosphors, with the highest value of 94 being seen with the 524 nm peaked green phosphor. For peaks of 532 through 522 nm, R9 increases as CCT increases and to a lesser extent as duv decreases. For green phosphors with a peak of 534 nm, R9 holds fairly constant through CCT and duv changes when CCT is around 2700K.

Table 1B below characterizes three simulated spectra for a white light emitting phosphor converted LED comprising a blue LED, a BR102/Q red phosphor, and a green phosphor having peak emission at 522 nm, 526 nm, or 532 nm and a FWHM of 35 nm. The CCT for these spectra is between 2600 K and 2850 K, nominally 2700 K.

TABLE 1B 2700K, green phosphor FWHM of 35 nm, red phosphor BR102/Q

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 522 nm (35 nm) | 90 | 0.004 | 103 | 84 | 62 | 308 | 33% (561 nm) |
| 526 nm (35 nm) | 93 | 0.005 | 103 | 75 | 73 | 315 | 37% (565 nm) |
| 532 nm (35 nm) | 90 | 0.009 | 99 | 53 | 92 | 328 | 43% (564 nm) |

The narrower (ca. 80 nm FWHM) and slightly blue shifted (4 nm) BR102/Q has the expected result of slightly lowering the maximum achievable CRI and R9 while increasing the overall LER; additionally, the shifting of the red phosphor spectrum shifts the range of green phosphors that pair with it to give maximum values of R9, CRI and R11. The various trends outlined above are similar with the shifted red phosphor, though also shifted. For example, maximum R11 values are observed with phosphors of a 532 nm peak wavelength. R9 trends outlined above also hold true regarding the changing of R9 with CCT and duv, none of the phosphor blends examined show a relatively constant R9 as was observed with the 534 nm green and ER6436.

Figure 2:
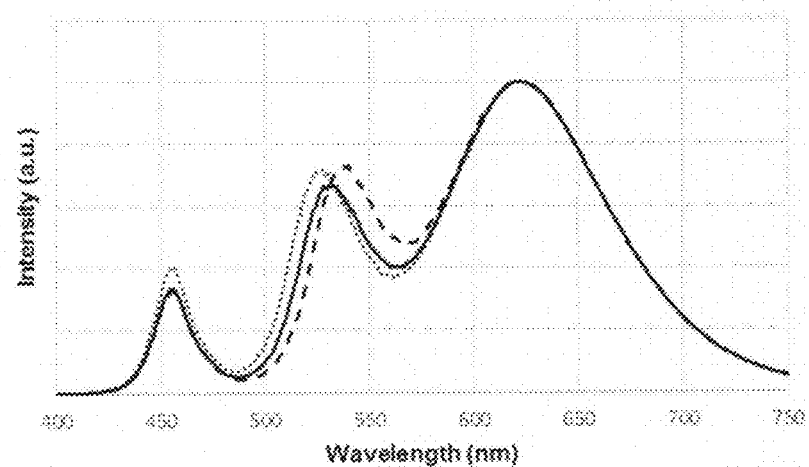
FIG. 2 shows normalized simulated spectra of 2700 K LEDs for green phosphor emission having a 35 nm FWHM peaking at 524 nm (dotted line,) 534 nm (dashed line), and 528 nm (solid line).

FIG. 2 shows normalized simulated spectra of 2700 K LEDs for green phosphor emission having a 35 nm FWHM peaking at 524 nm (dotted line,) 534 nm (dashed line), and 528 nm (solid line).

Table 2 below characterizes three simulated spectra for a white light emitting phosphor converted LED comprising a blue LED, an ER6436 red phosphor, and a green phosphor having peak emission at 520 nm, 526 nm, or 532 nm and a FWHM of 40 nm. The CCT for these spectra is between 2600 K and 2850 K, nominally 2700 K, and the CRI is greater than 90.

TABLE 2

2700K. green phosphor FWHM of 40 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 520 nm (40 nm) | 90 | 0.002 | 104 | 96 | 64 | 287 | 37% (559 nm) |
| 526 nm (40 nm) | 94 | 0.005 | 102 | 82 | 80 | 298 | 43% (565 nm) |
| 532 nm (40 nm) | 91 | 0.006 | 101 | 64 | 94 | 306 | 50% (570 nm) |

The trend with green phosphors of 40 nm FWHM seems to be that R11 has a maximum at phosphor wavelengths of 532 nm. R11 values then decrease as peak wavelength moves to 534 nm, or decreases to 520 nm. The R9 value trend is very dependent upon not just green phosphor peak wavelength, but also CCT and duv. For this particular combination of CCT and CRI, R9 appears to show a relative maximum with the 520 nm phosphor, with the highest value of 96. For peaks of 534 through 520 nm, R9 increases as CCT increases and to a lesser extent as duv decreases.

Figure 3:
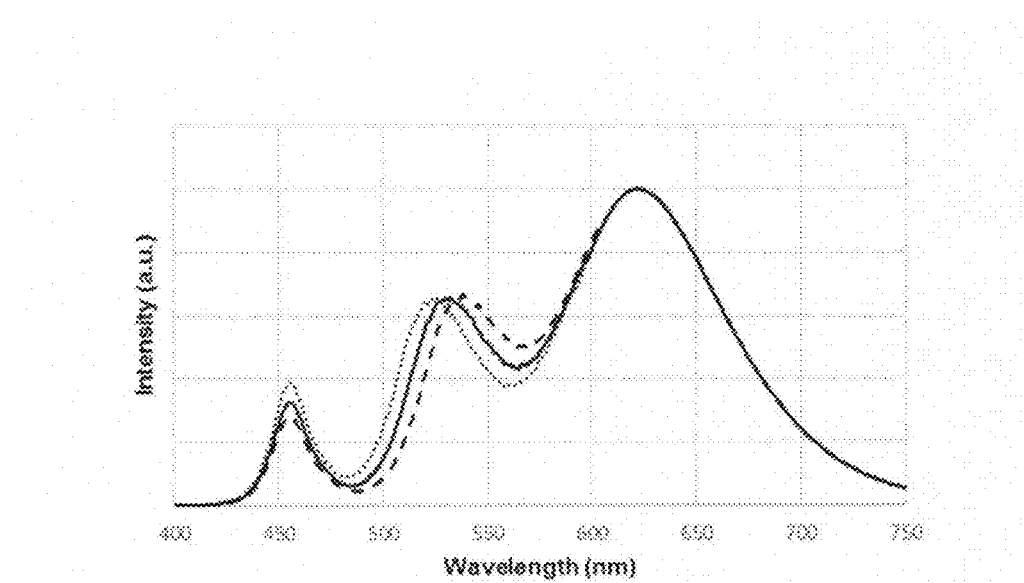
FIG. 3. shows normalized simulated spectra of 2700 K LEDs for green phosphor emission having a 40 nm FWHM peaking at 520 nm (dotted line), 532 nm (dashed line), and 526 nm (solid line).

FIG. 3 shows normalized simulated spectra of 2700 K LEDs for green phosphor emission having a 40 nm FWHM peaking at 520 nm (dotted line), 532 nm (dashed line), and 526 nm (solid line).

Figure 4A:
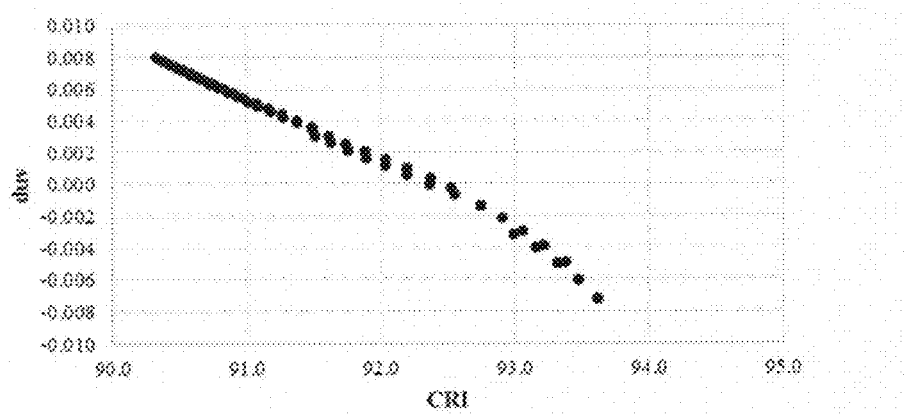
FIG. 4A is a plot of duv against CRI for simulated phosphor-converted LEDs comprising a blue LED, an ER6436 red phosphor, and a green phosphor having peak emission at 532 nm and a FWHM of 40 nm

It is generally accepted that CRI for a white light emitting phosphor-converted LED increases as the color point of a particular phosphor blend moves lower in CIE color space, usually characterized by a decreasing duv. FIG. 4A plots duv on the vertical axis against CRI on the horizontal axis for simulated phosphor-converted LEDs comprising a blue LED, an ER6436 red phosphor, and a green phosphor having peak emission at 532 nm and a FWHM of 40 nm. The CCT for these spectra is between 2600 K and 2850 K, nominally 2700 K. This plot shows the expected trend of CRI increasing as duv decreases over a CRI range of about 90 to about 94.

Figure 4B:
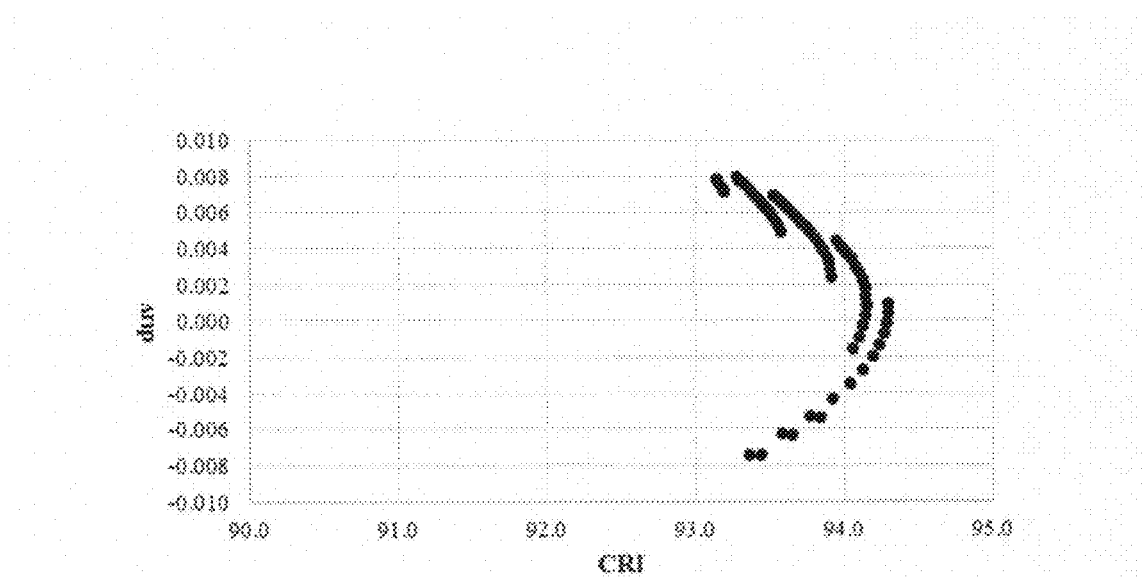
FIG. 4B is a plot of duv against CRI for simulated phosphor-converted LEDs comprising a blue LED, an ER6436 red phosphor, and a green phosphor having peak emission at 528 nm and a FWHM of 40 nm.

FIG. 4B plots duv on the vertical axis against CRI on the horizontal axis for simulated phosphor-converted LEDs comprising a blue LED, an ER6436 red phosphor, and a green phosphor having peak emission at 528 nm and a FWHM of 40 nm. The CCT for these spectra is between 2600 K and 2850 K, nominally 2700 K. This plot shows a relatively consistent CRI of about 93 to about 94 across the entire range that would be considered "white light."

Figure 4C:
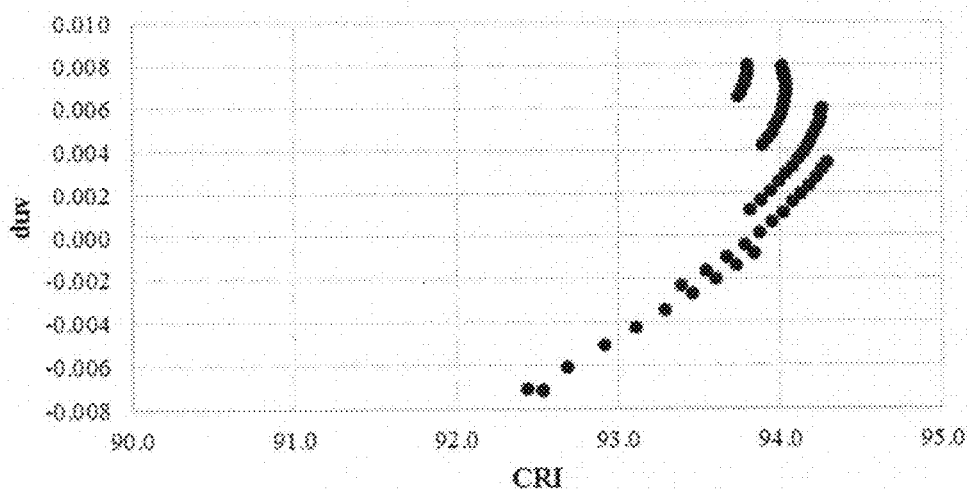
FIG. 4C is a plot of duv against CRI for simulated phosphor-converted LEDs comprising a blue LED, an ER6436 red phosphor, and a green phosphor having peak emission at 526 nm and a FWHM of 40 nm.

FIG. 4C plots duv on the vertical axis against CRI on the horizontal axis for simulated phosphor-converted LEDs comprising a blue LED, an ER6436 red phosphor, and a green phosphor having peak emission at 526 nm and a FWHM of 40 nm. The CCT for these spectra is between 2600 K and 2850 K, nominally 2700 K. This plot also shows a relatively consistent CRI of about 93 to about 94 across the entire range that would be considered "white light."

Table 3 below characterizes three simulated spectra for a white light emitting phosphor converted LED comprising a blue LED, an ER6436 red phosphor, and a green phosphor having peak emission at 518 nm, 524 nm, or 530 nm and a FWHM of 45 nm. The CCT for these spectra is between 2600 K and 2850 K, nominally 2700 K, and the CRI is greater than 90.

TABLE 3

2700K, green phosphor FWHM of 45 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 518 nm (45 nm) | 90 | 0.001 | 104 | 96 | 66 | 295 | 38% (559 nm) |
| 524 nm (45 nm) | 95 | 0.003 | 104 | 85 | 81 | 294 | 44% (565 nm) |
| 530 nm (45 nm) | 91 | 0.007 | 100 | 62 | 95 | 306 | 50% (570 nm) |

The trend with green phosphors of 45 nm FWHM seems to be that R11 has a maximum at phosphor wavelengths of 530 nm. R11 values then decrease as peak wavelength moves to 532 nm, or decreases to 518 nm. The R9 value trend is very dependent upon not just green phosphor peak wavelength, but also CCT and duv. For this particular combination of CCT and CRI, R9 appears to show a relative maximum with the 518 nm phosphor, with the highest value of 96. For peaks of 532 through 518 nm, R9 increases as CCT increases and to a lesser extent as duv decreases.

Figure 5:
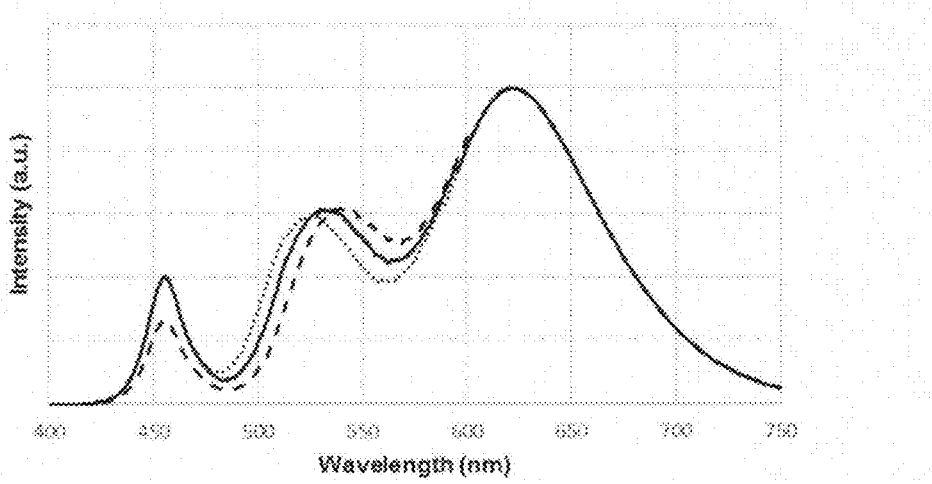
FIG. 5 shows normalized simulated spectra of 2700 K LEDs for green phosphor emission having a 45 nm FWHM peaking at 518 nm (dotted line), 530 nm (dashed line), and 524 nm (solid line).

FIG. 5 shows normalized simulated spectra of 2700 K LEDs for green phosphor emission having a 45 nm FWHM peaking at 518 nm (dotted line), 530 nm (dashed line), and 524 nm (solid line).

Similar to the CRI versus duv trends discussed above for simulated white light emitting phosphor-converted LEDs comprising green phosphors with 40 nm FWHM emission, simulated white light emitting phosphor-converted LEDs comprising green phosphors with peak emission at 530 nm to 536 nm and 45 nm FWHM show expected trends, with CRI ranges of 4 across the 2700K white region. For green peak emission around 528 nm, the CRI range begins to narrow, and with phosphors of 526 nm, the blends only create CRIs within 1 point across the white region. Once the peak emission wavelength of the green phosphor decreases to 522 nm, the blend shows the property of increasing CRI with increasing duv, and the CRI ranges approximately 3 points across the white region.

CCT 3000 K

Table 4A below characterizes four simulated spectra for a white light emitting phosphor converted LED comprising a blue LED, an ER6436 red phosphor, and a green phosphor having peak emission at 514 nm, 516 nm, 518 nm, or 520 nm and a FWHM of 35 nm. The CCT for these spectra is between 2850 K and 3250 K, nominally 3000 K, and the CRI is greater than 80.

TABLE 4A 3000K, green phosphor FWHM of 35 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 514 nm (35 nm) | 80 | 0.006 | 99 | 83 | 43 | 282 | 30% (557 nm) |
| 516 nm (35 nm) | 83 | 0.006 | 100 | 86 | 46 | 285 | 31% (555 nm) |
| 518 nm (35 nm) | 85 | 0.006 | 102 | 89 | 51 | 288 | 33% (557 nm) |
| 520 nm (35 nm) | 87 | 0.006 | 102 | 94 | 56 | 291 | 34% (559 nm) |

Table 4B below characterizes a simulated spectrum for a white light emitting phosphor converted LED comprising a blue LED having peak emission at 457 nm with a FWHM of 21 nm, a BR102/Q red phosphor, and a green phosphor having peak emission at 517 nm and a FWHM of 36 nm. The CCT for this spectrum is between 2850 K and 3250 K, nominally 3000 K.

TABLE 4B 3000K, green phosphor FWHM of 36 nm, red phosphor BR102/Q

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 517 nm (36 nm) *BR102Q simulation | 84 | .001 | 103 | 92 | 50 | 297 | 31% (556 nm) |

Table 4C below characterizes a measured spectrum for an example white light emitting phosphor converted LED (sample number JM388F9-28ma) comprising a blue LED having peak emission at 457 nm with a FWHM of 21 nm, a BR102/Q red phosphor, and a green phosphor (sample KB3-170-545) having peak emission at 517 nm and a FWHM of 36 nm. The CCT for this spectrum is between 2850 K and 3250 K, nominally 3000 K

TABLE 4C 3000K, green phosphor FWHM of 36 nm, red phosphor BR102/Q - built

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 517 nm (36 nm) | 83 | .001 | 104 | 92 | 45 | 296 | 27% (555 nm) |

The trend with green phosphors of 35 nm FWHM seems to be that R11 has a maximum at phosphor wavelengths of 520 nm. R11 values then decrease as peak wavelength decreases. The R9 value trend is very dependent upon not just green phosphor peak wavelength, but also CCT and duv. For peaks of 520 through 516 nm, R9 increases as duv increases and as CCT decreases. For green phosphors with a peak of 514 nm, R9 holds fairly constant through CCT and duv changes when CCT is around 3000K. The highest R9 values were obtained with phosphors peaked at 520 nm and some with 518 nm (R9>90).

Figure 6:
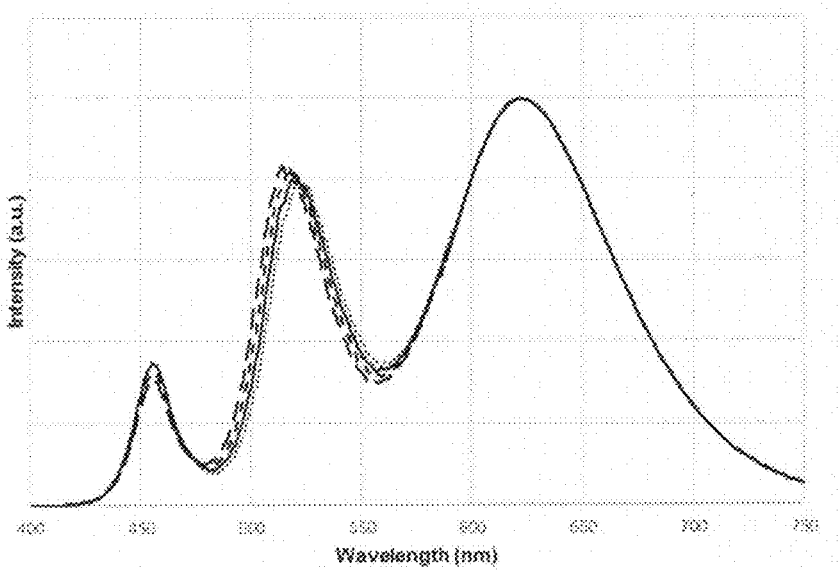
FIG. 6 shows normalized simulated spectra of 3000 K LEDs for green phosphor emission having a 35 nm FWHM peaking at 514 nm (long dashed line), 516 nm (dotted line), 518 nm (dashed line), and 520 nm (solid line).

FIG. 6 shows normalized simulated spectra of 3000 K LEDs for green phosphor emission having a 35 nm FWHM peaking at 514 nm (long dashed line), 516 nm (dotted line), 518 nm (dashed line), and 520 nm (solid line).

Figure 7:
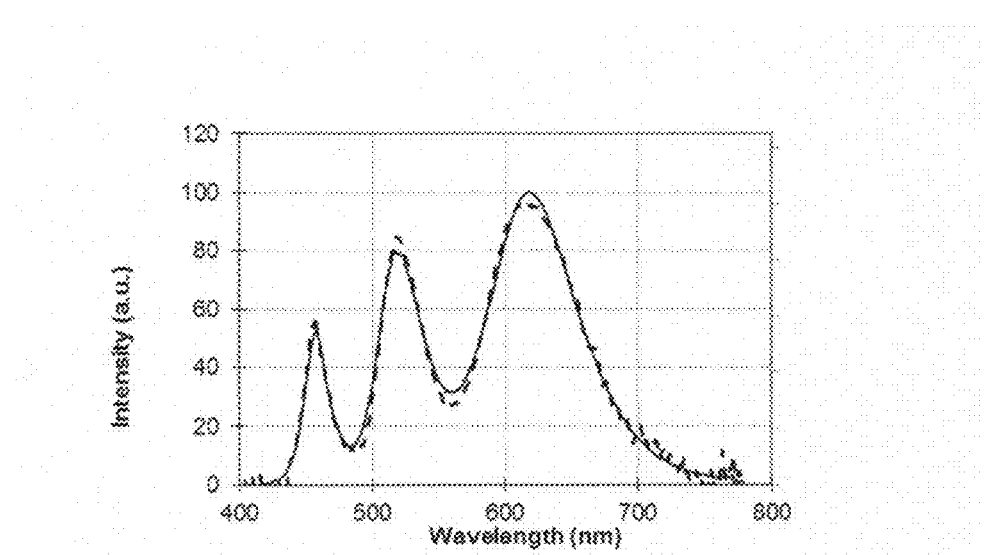
FIG. 7 shows a simulated spectrum for a 3000 K LED for green phosphor emission having a 36 nm FWHM peaking at 517 nm (solid line), and a measured spectrum for the example phosphor-converted LED characterized in Table 4C (dashed line).

FIG. 7 shows a simulated spectrum for a 3000 K LED for green phosphor emission having a 36 nm FWHM peaking at 517 nm (solid line), and a measured spectrum for the example phosphor-converted LED characterized in Table 4C (dashed line).

Table 5A below characterizes a simulated spectrum for a white light emitting phosphor converted LED comprising a blue LED, an ER6436 red phosphor, and a green phosphor having peak emission at 522 nm and a FWHM of 40 nm. A green phosphor having these spectral characteristics has been prepared as sample number YBG170620-1 (521-41). The CCT for this spectrum is between 2850 K and 3250 K, nominally 3000 K, and the CRI is greater than 90.

TABLE 5A 3000K, green phosphor FWHM of 40 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 522 nm (40 nm) | 90 | .009 | 102 | 98 | 69 | 300 | 42% (561 nm) |

Table 5B below characterizes a simulated spectrum for a white light emitting phosphor converted LED comprising a blue LED, an ER6436 red phosphor, and a green phosphor having peak emission at 530 nm and a FWHM of 40 nm. A green phosphor having these spectral characteristics has been prepared as sample number KB3-123-486 (530-39). The CCT for this spectrum is between 2850 K and 3250 K, nominally 3000 K.

TABLE 5B 3000K, green phosphor FWHM of 40 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 530 nm (40 nm) | 92 | .007 | 103 | 81 | 89 | 309 | 51% (569 nm) |

Table 5C below characterizes a simulated spectrum for a white light emitting phosphor converted LED comprising a blue LED, an ER6436 red phosphor, and a green phosphor having peak emission at 534 nm and a FWHM of 40 nm. A green phosphor having these spectral characteristics has been prepared as sample number ELT-069 (533-41). The CCT for this spectrum is between 2850 K and 3250 K, nominally 3000 K.

TABLE 5C 3000K, green phosphor FWHM of 40 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 534 nm (40 nm)) | 90 | .011 | 104 | 71 | 90 | 304 | 55% (573 nm) |

The trend with green phosphors of 40 nm FWHM seems to be that R11 has a maximum at phosphor wavelengths of 532 nm. R11 values then decrease as peak wavelength increases to 534 nm or decreases down to 522 nm. The R9 value trend is very dependent upon not just green phosphor peak wavelength, but also CCT and duv. For peaks of 534 through 524 nm, R9 increases as duv decreases and as CCT increases. For green phosphors with a peak of 522 nm, R9 holds fairly constant through CCT and duv changes when CCT is around 3000 K, also corresponding with some of the highest R9 values obtained (R9>95).

Figure 8:
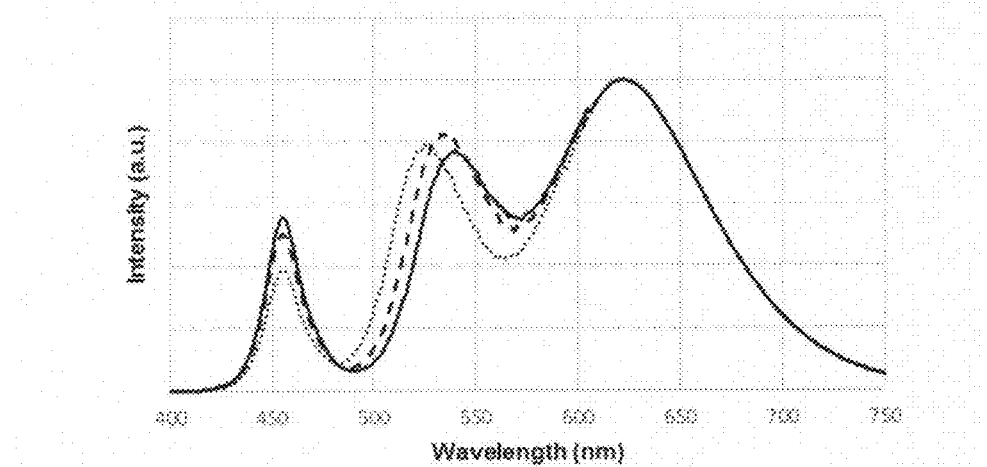
FIG. 8 shows normalized simulated spectra of 3000 k LEDs for green phosphor emission having a 40 nm FWHM peaking at 522 nm (dotted line), 530 nm (dashed line), and 534 nm (solid line).

FIG. 8 shows normalized simulated spectra of 3000 K LEDs for green phosphor emission having a 40 nm FWHM peaking at 522 nm (dotted line), 530 nm (dashed line), and 534 nm (solid line).

Figure 9A:
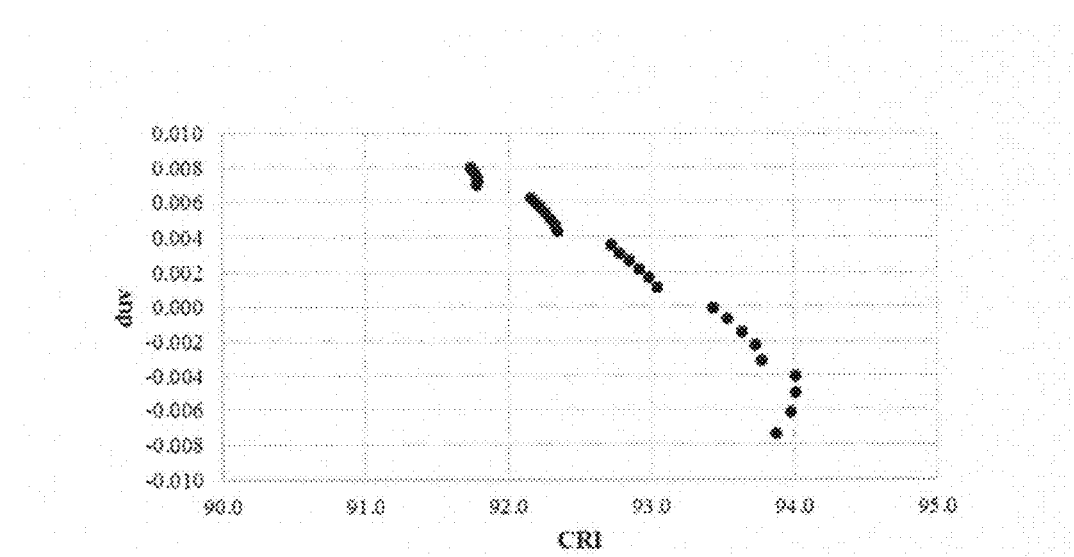
FIG. 9A is a plot of duv against CRI for simulated phosphor-converted LEDs comprising a blue LED, an ER6436 red phosphor, and a green phosphor having peak emission at 530 nm.

FIG. 9A plots duv on the vertical axis against CRI on the horizontal axis for simulated phosphor-converted LEDs comprising a blue LED, an ER6436 red phosphor, and a green phosphor having peak emission at 530 nm. Through most of the white range CRI ranges from 92-94, increasing as duv decreases.

Figure 9B:
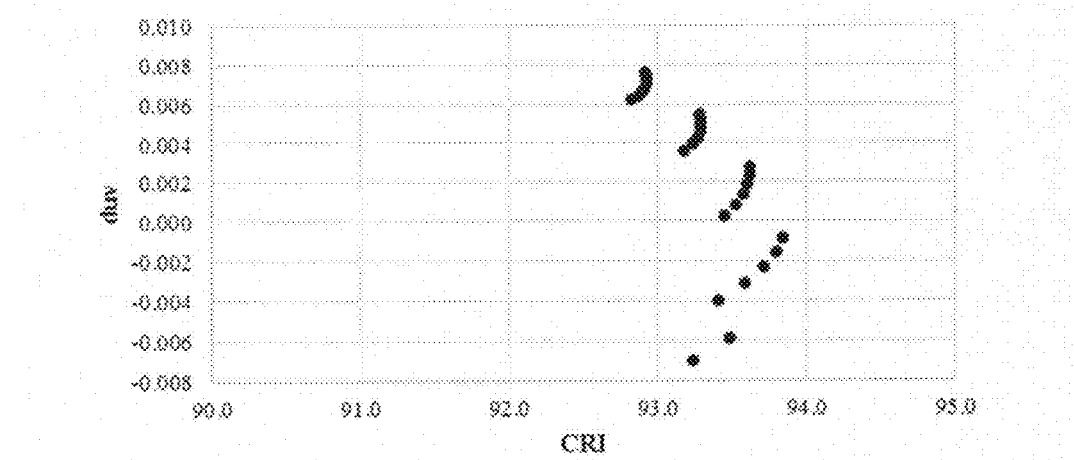
FIG. 9B is a plot of duv against CRI for simulated phosphor-converted LEDs comprising a blue LED, an ER6436 red phosphor, and a green phosphor having peak emission at 528 nm.

FIG. 9B plots duv on the vertical axis against CRI on the horizontal axis for simulated phosphor-converted LEDs comprising a blue LED, an ER6436 red phosphor, and a green phosphor having peak emission at 528 nm. The CRI is very consistent ranging only about 1 point through the entire white region of 3000K.

Figure 9C:
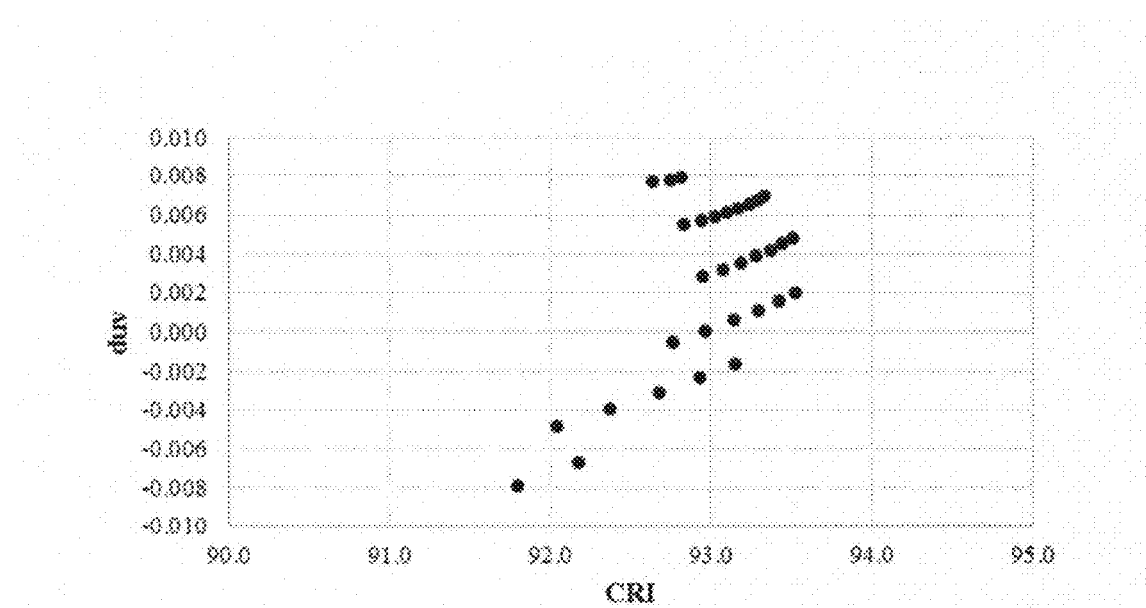
FIG. 9C is a plot of duv against CRI for simulated phosphor-converted LEDs comprising a blue LED, an ER6436 red phosphor, and a green phosphor having peak emission at 526 nm.

FIG. 9C plots duv on the vertical axis against CRI on the horizontal axis for simulated phosphor-converted LEDs comprising a blue LED, an ER6436 red phosphor, and a green phosphor having peak emission at 526 nm. This plots shows a tight grouping of CRI values similar to that in FIG. 9B.

Figure 9D:
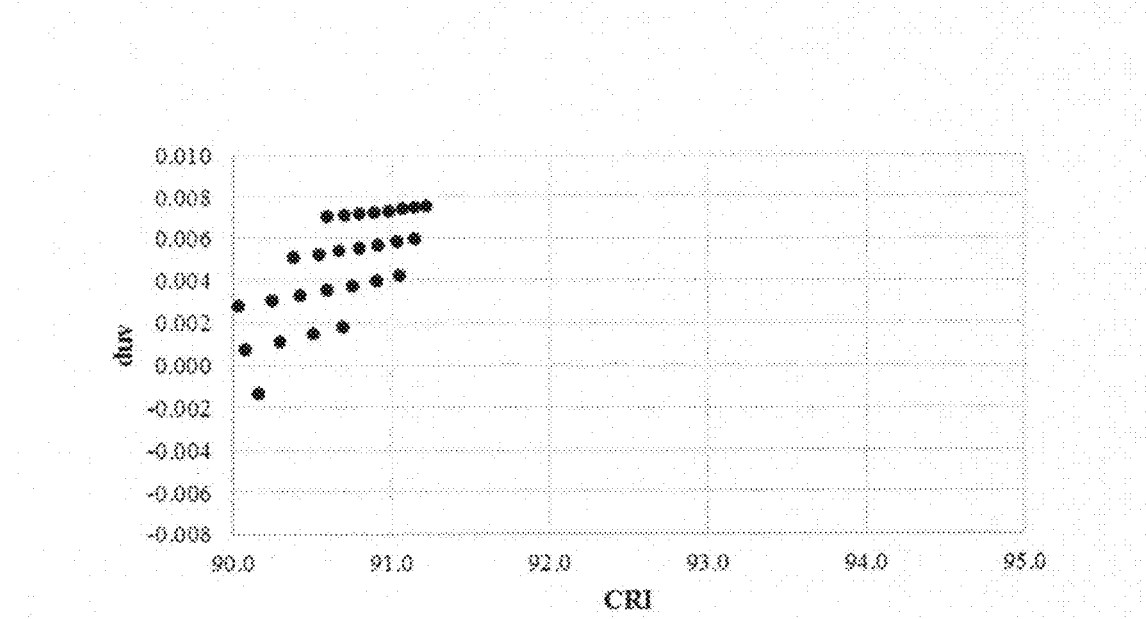
FIG. 9D is a plot of duv against CRI for simulated phosphor-converted LEDs comprising a blue LED, an ER6436 red phosphor, and a green phosphor having peak emission at 522 nm.

FIG. 9D plots duv on the vertical axis against CRI on the horizontal axis for simulated phosphor-converted LEDs comprising a blue LED, an ER6436 red phosphor, and a green phosphor having peak emission at 522 nm. In this plot CRI increases as duv increases.

Table 6A below characterizes two simulated spectra for a white light emitting phosphor converted LED comprising a blue LED, an ER6436 red phosphor, and a green phosphor having peak emission at 520 nm, or 524 nm and a FWHM of 45 nm. The CCT for these spectra is between 2850 K and 3250 K, nominally 3000 K, and the CRI is greater than 90.

TABLE 6A 3000K, green phosphor FWHM of 40 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 520 nm (45 nm) | 91 | 0.006 | 102 | 98 | 71 | 295 | 43% (563 nm) |
| 524 nm (45 nm) | 94 | 0.006 | 102 | 87 | 80 | 300 | 46% (563 nm) |

Table 6B below characterizes a simulated spectrum for a white light emitting phosphor converted LED comprising a blue LED, an ER6436 red phosphor, and a green phosphor having peak emission at 530 nm and a FWHM of 45 nm. Green phosphors having these spectral characteristics have been prepared as sample numbers ELT047C (531-45) and YBG 170403-4B (530-44). The CCT for these spectra is between 2850 K and 3250 K, nominally 3000 K.

TABLE 6B 3000K, green phosphor FWHM of 40 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 530 nm (45 nm) | 92 | 0.006 | 101 | 71 | 93 | 308 | 53% (569 nm) |

The trend here seems to be that R11 is a maximum at phosphor wavelengths of 530 and 532 nm. R11 values then decrease as peak wavelength increases to 534 nm or decreases down to 518 nm. The R9 value trend is very dependent upon not just green phosphor peak wavelength, but also CCT and duv. For peaks of 532 through 524 nm, R9 increases as duv decreases and as CCT increases. For green phosphors with peaks of 522 and 520 nm, R9 holds fairly constant through CCT and duv changes when CCT is around 3000K, also corresponding with some of the highest R9 values obtained (R9>95).

Figure 10:
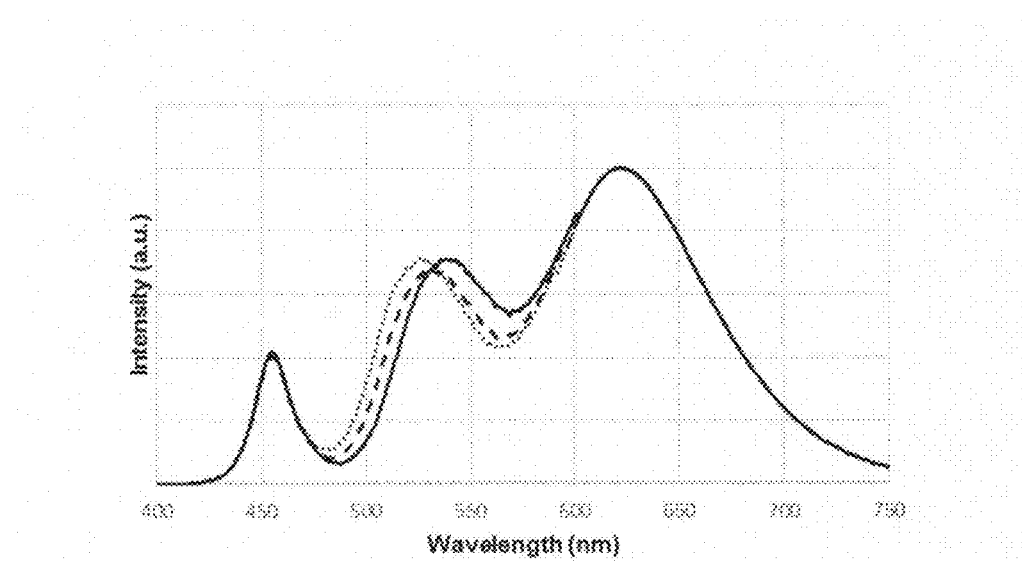
FIG. 10 shows normalized simulated spectra of 3000 K LEDs for green phosphor emission having a 45 nm FWHM peaking at 20 nm (dotted line,) 524 nm (dashed line), and 530 nm (solid line).

FIG. 10 shows normalized simulated spectra of 3000 K LEDs for green phosphor emission having a 45 nm FWHM peaking at 20 nm (dotted line,) 524 nm (dashed line), and 530 nm (solid line).
CCT 3500 K Table 7A below characterizes three simulated spectra for a white light emitting phosphor converted LED comprising a blue LED, an ER6436 red phosphor, and a green phosphor having peak emission at 516 nm, 518 nm, or 520 nm and a FWHM of 35 nm. The CCT for these spectra is between 3250 K and 3750 K, nominally 3500 K, and the CRI is greater than 80.

TABLE 7A 3500K, green phosphor FWHM of 35 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 516 nm (35 nm) | 80 | 0.004 | 105 | 65 | 44 | 282 | 33% (559 nm) |
| 518 nm (35 nm) | 83 | 0.006 | 104 | 70 | 50 | 287 | 35% (561 nm) |
| 520 nm (35 nm) | 84 | 0.006 | 105 | 74 | 54 | 290 | 37% (559 nm) |

Table 7B below characterizes a simulated spectrum for a white light emitting phosphor converted LED comprising a blue LED having a peak emission at 457 nm with a FWHM of 21 nm, a BR102/Q red phosphor, and a green phosphor having peak emission at 517 nm and a FWHM of 36 nm. The CCT for these spectra is between 3250 K and 3750 K, nominally 3500 K.

TABLE 7B 3500K, green phosphor FWHM of 36 nm, red phosphor BR102/Q

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 517 nm (36 nm) | 84 | −0.004 | 106 | 83 | 51 | 294 | 34% (559 nm) |

Table 7C below characterizes a measured spectrum for an example white light emitting phosphor converted LED (sample JM388-E3-59) comprising a blue LED having peak emission at 457 nm with a FWHM of 21 nm, a BR102/Q red phosphor, and a green phosphor having peak emission at 517 nm and a FWHM of 36 nm. The CCT for this spectrum is between 3250 K and 3750 K, nominally 3500 K.

TABLE 7C 3500K, green phosphor FWHM of 36 nm, red phosphor BR102/Q - built

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 517 nm (36 nm) | 84 | −0.004 | 107 | 86 | 49 | 291 | 33% (558 nm) |

As seen in Table 8 below, for example, the trend here seems to be that R9 increases with distance above the Planckian locus and also R9 increases with decreasing CCT. There is a clear trend of increased R11 and increased phosphor wavelength with the phosphors between 516 nm and 520 nm peak wavelength. Table 8 reports R9 values for selected CCT and duv for simulated spectra for a white light emitting phosphor-converted LED comprising a blue LED, an ER6436 red phosphor, and a green phosphor having peak emission at 520 nm and a FWHM of 35.

TABLE 8

R9 for selected CCT and duv

| | 3680-3730K | 3570-3580K | 3440-3480K | 3360-3390K | 3270-3350K |
|---|---|---|---|---|---|
| duv = 0.005-0.007 | 69 | 71 | 74 | 76 | 78 |
| duv = 0.003-0.004 | 67 | 69 | 72 | 75 | 77 |
| duv = 0.001-0.002 | 64 | 67 | 70 | 73 | 76 |
| duv = −0.001-−0.002 | 60 | 64 | 68 | | 72 |
| duv = −0.005 | | 61 | 66 | | 70 |

Figure 11:
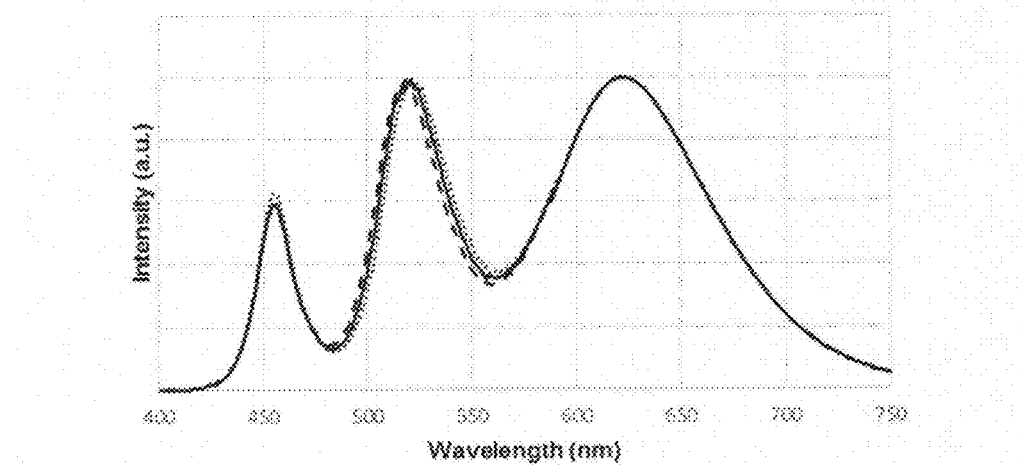
FIG. 11 shows normalized simulated spectra of 3500 K LEDs for green phosphor emission having a 35 nm FWHM peaking at 520 nm (dotted line), 518 nm (solid line) and 516 nm (dashed line).

FIG. 11 shows normalized simulated spectra of 3500 K LEDs for green phosphor emission having a 35 nm FWHM peaking at 520 nm (dotted line), 518 nm (solid line) and 516 nm (dashed line).

Figure 12:
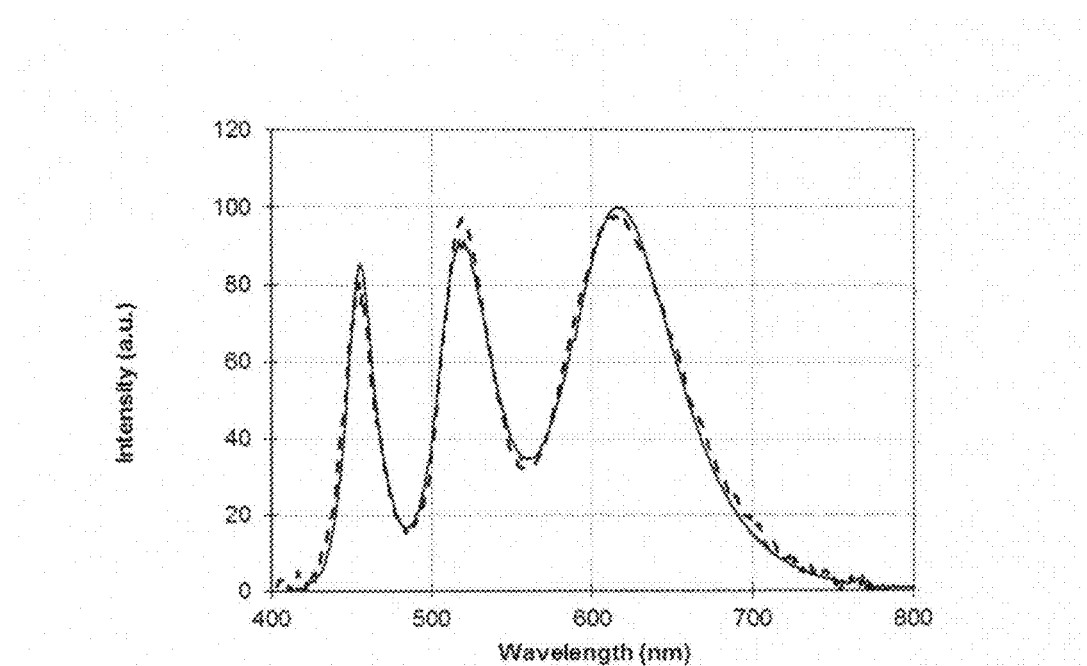
FIG. 12 shows a simulated spectrum for a 3500 K LED for green phosphor emission having a 36 nm FWHM peaking at 517 nm (solid line), and a measured spectrum for the example phosphor converted LED characterized in Table 7C (dashed line).

FIG. 12 shows a simulated spectrum for a 3500 K LED for green phosphor emission having a 36 nm FWHM peaking at 517 nm (solid line), and a measured spectrum for the example phosphor converted LED characterized in Table 7C (dashed line).

Table 9 below characterizes three simulated spectra for a white light emitting phosphor converted LED comprising a blue LED, an ER6436 red phosphor, and a green phosphor having peak emission at 524 nm, 528 nm, or 532 nm and a FWHM of 40 nm. The CCT for these spectra is between 3250 K and 3750 K, nominally 3500 K, and the CRI is greater than 90.

TABLE 9

3500K, green phosphor FWHM of 40 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 524 nm (40 nm) | 90 | 0.003 | 105 | 89 | 72 | 295 | 46% (563 nm) |
| 528 nm (40 nm) | 91 | 0.005 | 104 | 99 | 83 | 303 | 52% (567 nm) |
| 532 nm (40 nm) | 91 | 0.003 | 104 | 89 | 89 | 306 | 56% (571 nm) |

The trend here seems to be that R9 increases with distance above the Planckian locus and also R9 increases with decreasing CCT. For this particular combination of CCT and CRI, R9 appears to show a relative maximum with the 528 nm phosphor. There is a clear trend of increased R11 and increased phosphor wavelength with the phosphors between 524 nm and 532 nm peak wavelength. CRI versus duv follows the expected trend of increasing CRI with decreasing duv for phosphors of longer wavelength, such as 540-532 nm, with a range of 4 points across the region generally considered white. The CRI range compresses down to about 2 and shows no real correlation with duv for phosphors of peak wavelengths 526 and 528 nm. Shorter wavelength phosphors show a wider range of CRI, but with the inverted trend of increased CRI with increased duv.

Figure 13:
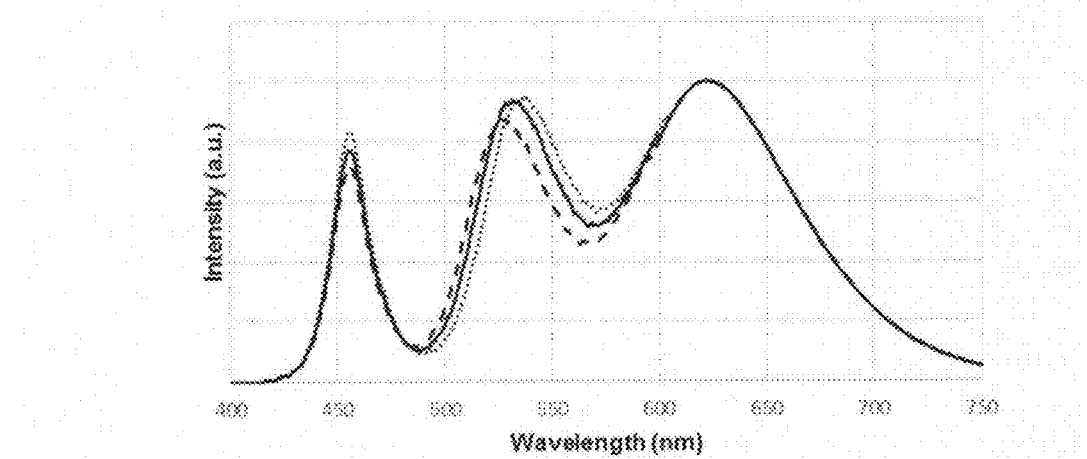
FIG. 13 shows normalized simulated spectra of 3500 K LEDs for green phosphor emission having a 40 nm FWHM peaking at 532 nm (dotted line), 528 nm (solid line), and 524 nm (dashed line).

FIG. 13 shows normalized simulated spectra of 3500 K LEDs for green phosphor emission having a 40 nm FWHM peaking at 532 nm (dotted line), 528 nm (solid line), and 524 nm (dashed line).

Table 10 below characterizes three simulated spectra for a white light emitting phosphor converted LED comprising a blue LED, an ER6436 red phosphor, and a green phosphor having peak emission at 530 nm, 526 nm, or 522 nm and a FWHM of 45 nm. The CCT for these spectra is between 3250 K and 3750 K, nominally 3500 K, and the CRI is greater than 90.

TABLE 10

3500K, green phosphor FWHM of 45 nm, red phosphor ER6436

| Green phosphor Peak (FWHM) | CRI | Duv | TM-30-15 Rg | R9 | R11 (strong green) | LER | Intensity and wavelength at minimum of yellow valley |
|---|---|---|---|---|---|---|---|
| 530 nm (45 nm) | 92 | 0.003 | 103 | 86 | 90 | 306 | 58% (569 nm) |
| 526 nm (45 nm) | 92 | 0.005 | 104 | 99 | 84 | 302 | 53% (569 nm) |
| 522 nm (45 nm) | 90 | 0.003 | 105 | 85 | 73 | 293 | 48% (570 nm) |

The trend here seems to be that R9 increases with distance above the Planckian locus and also R9 increases with decreasing CCT. For this particular combination of CCT and CRI, R9 appears to show a relative maximum with the 526 nm phosphor. There is a clear trend of increased R11 and increased phosphor wavelength with the phosphors between 522 nm and 532 nm peak wavelength with a slight relative maximum with phosphors with a 530 nm peak wavelength.

Figure 14:
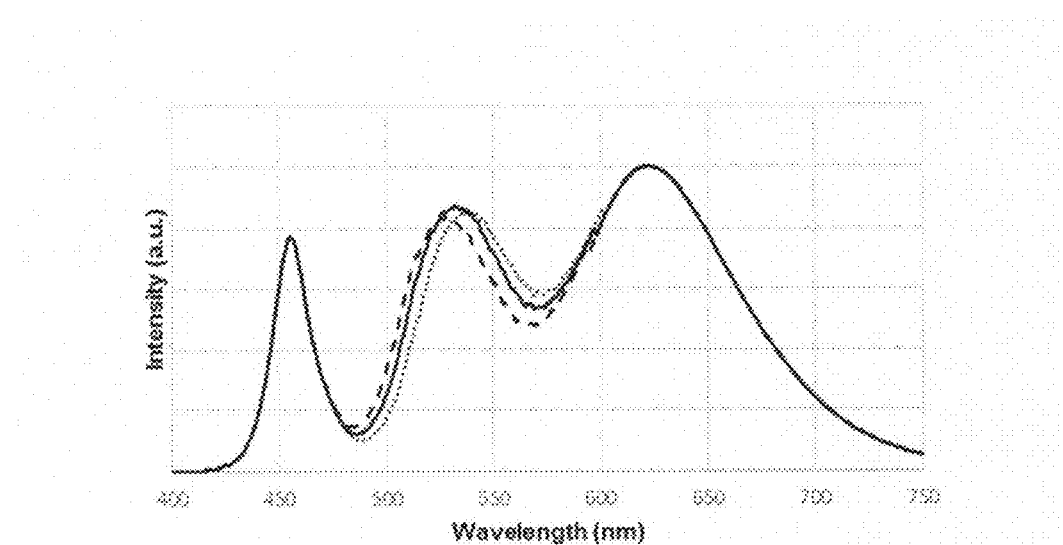
FIG. 14 shows normalized simulated spectra of 3500 K LEDs for green phosphor emission with 45 nm FWHM peaking at 530 nm (dotted line), 526 nm (solid line), and 522 nm (dashed line).

FIG. 14 shows normalized simulated spectra of 3500 K LEDs for green phosphor emission with 45 nm FWHM peaking at 530 nm (dotted line), 526 nm (solid line), and 522 nm (dashed line).

Figure 15:
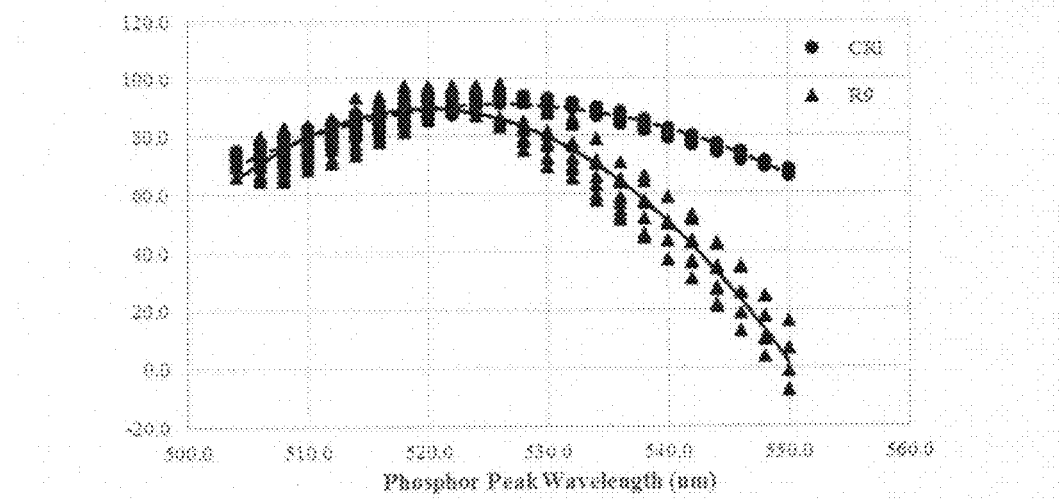
FIG. 15 plots CRI and R9 against green phosphor emission peak wavelength, on the horizontal axis, for simulated white light phosphor-converted LEDs comprising a blue LED, an ER6436 red phosphor, and a narrow green phosphor.

FIG. 15 plots CRI and R9 against green phosphor emission peak wavelength, on the horizontal axis, for simulated white light phosphor-converted LEDs comprising a blue LED, an ER6436 red phosphor, and a narrow green phosphor. The CCT for these simulated devices is nominally 3000 K with a duv of +0.003. The FWHM of the green phosphor emission varies. This plot shows that using a shorter peak wavelength green phosphor results in a higher value for R9.

Figure 16:
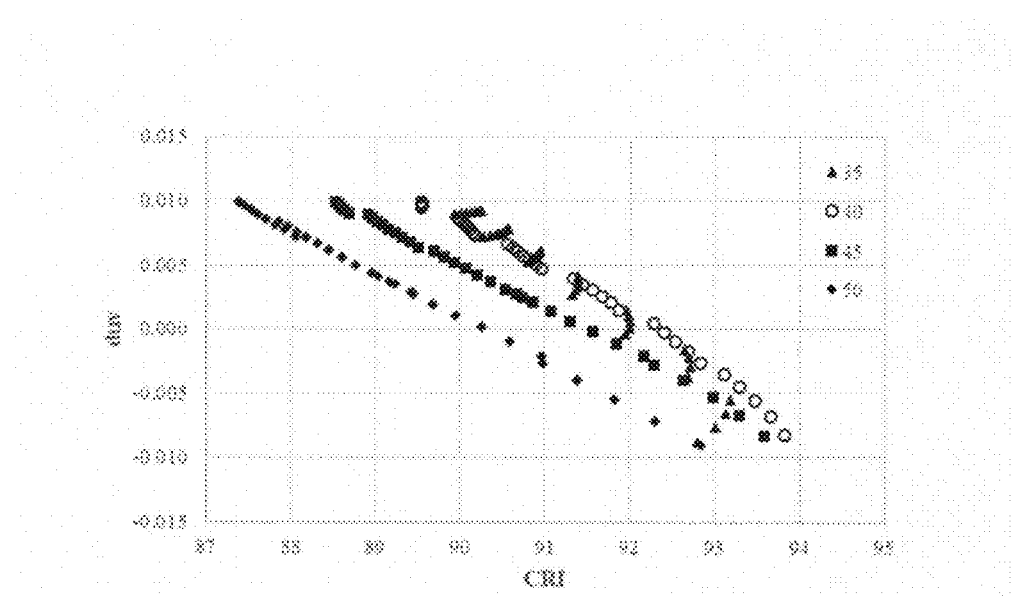
FIG. 16 plots CRI against duv for simulated white light phosphor-converted LEDs comprising a blue LED, an ER6436 red phosphor, and narrow green phosphors with peak wavelength of 532 nm and varying FWHM.

FIG. 16 plots CRI against duv for simulated white light phosphor-converted LEDs comprising a blue LED, an ER6436 red phosphor, and narrow green phosphors with peak wavelength of 532 nm and varying FWHM. The CCT for these simulated devices is nominally 3000 K. This plot shows that at this wavelength of green phosphors, the CRI generally increases as duv decreases. This trend follows the generally accepted trend. Additionally, the plot shows that the range of obtained CRI values decreases with decreasing FWHM.

Figure 17:
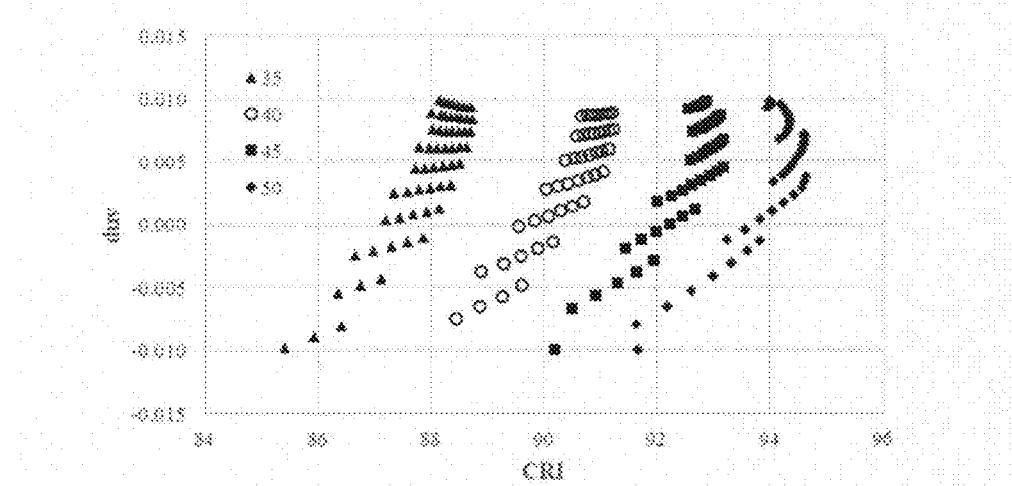
FIG. 17 plots CRI against duv for simulated white light phosphor-converted LEDs comprising a blue LED, an ER6436 red phosphor, and narrow green phosphors with peak wavelength of 522 nm and varying FWHM.

FIG. 17 plots CRI against duv for simulated white light phosphor-converted LEDs comprising a blue LED, an ER6436 red phosphor, and narrow green phosphors with peak wavelength of 522 nm and varying FWHM. The CCT for these simulated devices is nominally 3000 K. This plot shows that at this wavelength of green phosphors, the CRI generally increases as duv increases. This trend is opposite of the generally accepted trend where CRI generally decreases as duv increases. Additionally, the plot shows that the range of obtained CRI values decreases with decreasing FWHM.

Table 11 below characterizes several simulated spectra for a white light emitting phosphor converted LED comprising a blue LED having a peak emission wavelength between 450 nm and 470 nm, a red phosphor with a nominal 620 nm peak wavelength and a FWHM of 90 nm, and a green phosphor having peak emission between 508 nm and 534 nm, and a FWHM of between 40 nm and 50 nm. The CCT for these spectra is between 2850 K and 3250 K, nominally 3000 K.

TABLE 11

3000K with red phosphor peak 620 nm, FWHM 90 nm

| Green phosphor Peak (FWHM) | CRI | Duv | TM-30-15 Rg | R9 | R11 (strong green) | LER | Intensity and wavelength at minimum of yellow valley | Wavelength of LED |
|---|---|---|---|---|---|---|---|---|
| 508 nm (50 nm) | 84 | 0.003 | 85 | 62 | 82 | 301 | 40% (551 nm) | 470 |
| 510 nm (50 nm) | 85 | 0.003 | 86 | 63 | 84 | 303 | 42% (549 nm) | 470 |
| 512 nm (50 nm) | 85 | 0.003 | 87 | 65 | 86 | 304 | 45% (551 nm) | 470 |
| 514 nm (50 nm) | 95 | 0.003 | 98 | 50 | 88 | 314 | 47% (553 nm) | 455 |
| 514 nm (50 nm) | 94 | 0.003 | 100 | 48 | 87 | 314 | 47% (553 nm) | 450 |
| 514 nm (45 nm) | 86 | 0.003 | 87 | 60 | 86 | 305 | 43% (553 nm) | 470 |
| 516 nm (50 nm) | 95 | 0.003 | 99 | 49 | 91 | 316 | 50% (555 nm) | 455 |
| 516 nm (50 nm) | 94 | 0.003 | 96 | 52 | 92 | 314 | 50% (555 nm) | 460 |
| 516 nm (45 nm) | 87 | 0.003 | 88 | 59 | 88 | 307 | 45% (555 nm) | 470 |
| 518 nm (50 nm) | 94 | 0.003 | 96 | 52 | 95 | 316 | 53% (557 nm) | 460 |
| 518 nm (50 nm) | 94 | 0.003 | 99 | 48 | 93 | 317 | 53% (557 nm) | 455 |
| 518 nm (45 nm) | 94 | 0.003 | 96 | 49 | 92 | 315 | 48% (557 nm) | 460 |
| 532 nm (40 nm) | 83 | 0.003 | 99 | 26 | 81 | 331 | 63% (564 nm) | 455 |
| 532 nm (45 nm) | 82 | 0.003 | 98 | 25 | 78 | 333 | 70% (564 nm) | 455 |
| 532 nm (45 nm) | 81 | 0.003 | 100 | 22 | 79 | 333 | 70% (564 nm) | 450 |
| 532 nm (50 nm) | 81 | 0.003 | 98 | 21 | 75 | 334 | 74% (571 nm) | 455 |
| 532 nm (45 nm) | 81 | 0.003 | 100 | 20 | 78 | 333 | 68% (564 nm) | 450 |
| 532 nm (50 nm) | 81 | 0.003 | 97 | 19 | 75 | 334 | 72% (564 nm) | 455 |
| 534 nm (40 nm) | 81 | 0.003 | 98 | 22 | 76 | 333 | 67% (566 nm) | 455 |

Table 12 below characterizes several simulated spectra for a white light emitting phosphor converted LED comprising a blue LED having a peak emission wavelength between 430 nm and 455 nm, a red phosphor with a nominal 620 nm peak wavelength and a FWHM of 90 nm, and a green phosphor having peak emission between 504 nm and 524 nm, and a FWHM of between 35 nm and 50 nm. The CCT for these spectra is between 3750 K and 4250 K, nominally 4000 K.

TABLE 12

4000K with red phosphor peak 620 nm, FWHM 90 nm, Duv 0.003

| Green phosphor Peak (FWHM) | CRI | Duv | TM-30-15 Rg | R9 | R11 (strong green) | LER | Intensity and wavelength at minimum of yellow valley | Wavelength of LED |
|---|---|---|---|---|---|---|---|---|
| 504 nm (50 nm) | 87 | 0.003 | 103 | 97 | 62 | 289 | 45% (557 nm) | 440 |
| 506 nm (40 nm) | 84 | 0.003 | 105 | 97 | 52 | 282 | 36% (554 nm) | 430 |
| 506 nm (40 nm) | 84 | 0.003 | 103 | 97 | 54 | 290 | 37% (554 nm) | 440 |
| 506 nm (45 nm) | 86 | 0.003 | 105 | 97 | 57 | 286 | 42% (554 nm) | 435 |
| 506 nm (50 nm) | 88 | 0.003 | 102 | 97 | 65 | 293 | 47% (559 nm) | 445 |
| 508 nm (40 nm) | 86 | 0.003 | 106 | 97 | 54 | 288 | 38% (556 nm) | 435 |
| 510 nm (35 nm) | 85 | 0.003 | 108 | 97 | 48 | 289 | 32% (553 nm) | 435 |
| 514 nm (35 nm) | 89 | 0.003 | 105 | 97 | 58 | 297 | 37% (553 nm) | 450 |
| 514 nm (50 nm) | 95 | 0.003 | 103 | 80 | 78 | 306 | 55% (562 nm) | 450 |
| 516 nm (40 nm) | 93 | 0.003 | 105 | 88 | 69 | 304 | 49% (559 nm) | 450 |
| 516 nm (45 nm) | 93 | 0.003 | 106 | 77 | 73 | 308 | 55% (559 nm) | 445 |
| 516 nm (50 nm) | 93 | 0.003 | 105 | 76 | 78 | 308 | 58% (564 nm) | 445 |
| 518 nm (40 nm) | 94 | 0.003 | 102 | 84 | 76 | 307 | 52% (557 nm) | 455 |
| 518 nm (50 nm) | 96 | 0.003 | 100 | 74 | 87 | 311 | 60% (566 nm) | 455 |
| 520 nm (35 nm) | 94 | 0.003 | 103 | 84 | 73 | 309 | 46% (559 nm) | 455 |
| 520 nm (40 nm) | 94 | 0.003 | 105 | 76 | 77 | 311 | 55% (559 nm) | 450 |
| 520 nm (45 nm) | 94 | 0.003 | 104 | 71 | 82 | 313 | 60% (559 nm) | 450 |
| 520 nm (50 nm) | 93 | 0.003 | 103 | 66 | 87 | 314 | 63% (563 nm) | 450 |
| 522 nm (40 nm) | 90 | 0.003 | 107 | 70 | 77 | 314 | 57% (561 nm) | 445 |
| 522 nm (40 nm) | 88 | 0.003 | 108 | 67 | 75 | 313 | 57% (561 nm) | 440 |
| 522 nm (45 nm) | 90 | 0.003 | 105 | 64 | 82 | 317 | 63% (561 nm) | 445 |
| 522 nm (45 nm) | 87 | 0.003 | 107 | 61 | 80 | 316 | 63% (561 nm) | 440 |
| 522 nm (50 nm) | 89 | 0.003 | 105 | 59 | 86 | 318 | 67% (565 nm) | 445 |
| 522 nm (50 nm) | 87 | 0.003 | 106 | 57 | 84 | 317 | 67% (565 nm) | 440 |
| 524 nm (35 nm) | 89 | 0.003 | 107 | 70 | 75 | 316 | 49% (563 nm) | 445 |
| 524 nm (35 nm) | 87 | 0.003 | 109 | 67 | 73 | 315 | 49% (563 nm) | 440 |
| 524 nm (40 nm) | 94 | 0.003 | 101 | 67 | 88 | 317 | 59% (563 nm) | 455 |

Table 13 below shows the attributes of commercially available LEDs purchased and tested by the applicant. These LEDs utilize green-yellow phosphors significantly broader than those disclosed herein, and as such do not display a valley in the emission spectra.

TABLE 13 commercially available LEDs

| CCT of Commercially Purchased LEDs | CRI | Duv | TM-30-15 Rg | R9 | R11 (strong green) | LER | Intensity and wavelength at minimum of yellow valley |
|---|---|---|---|---|---|---|---|
| 2700 | 82 | −0.003 | 93 | 7 | 75 | 323 | n/a |
| 2700 | 91 | −0.003 | 96 | 59 | 87 | 285 | n/a |
| 3000 | 82 | −0.004 | 96 | 4 | 78 | 330 | n/a |
| 3000 | 91 | 0.000 | 98 | 55 | 90 | 297 | n/a |
| 3500 | 84 | −0.003 | 93 | 22 | 76 | 318 | n/a |
| 3500 | 94 | −0.002 | 96 | 72 | 91 | 290 | n/a |

Example Narrow Green Phosphors

KB3-170-545, 517 nm peak, 36 nm FWHM. 0.523 g Eu, 0.106 g CaS, 0.886 g $Al_2S_3$, 0.174 g $Ga_2S_3$, 0.110 g S and 0.090 g $AlCl_3$ were ground and then divided into 4 quartz tubes sealed under vacuum. The tubes were heated together to 400° C. for one hour and then the temperature was increased to 900° C. and held for 6 hours. The furnace was cooled at 50° C. per hour. The tubes were opened under inert atmosphere and ground together to combine them.

KB3-163-537, 527 nm peak, 41 nm FWHM. 0.562 g Eu, 0.446 g $Al_2S_3$, 0.412 g $Ga_2S_3$, 0.112 g S and 0.075 g $AlCl_3$ were ground and then divided into 4 quartz tubes sealed under vacuum. The tubes were heated together to 400° C. for one hour and then the temperature was increased to 900° C. and held for 6 hours. The furnace was cooled at 50° C. per hour. The tubes were opened under inert atmosphere and their contents ground together to combine them.

KB3-117-475a, 529 nm peak, 41 nm FWHM. 0.225 g Eu, 0.166 g $Al_2S_3$, 0.209 g $Ga_2S_3$, 0.020 g S and 0.045 g $AlCl_3$ were ground and then divided into 2 quartz tubes sealed under vacuum. One of the tubes was heated to 400° C. for one hour and then the temperature was increased to 900° C. and held for 6 hours. The furnace was cooled at 50° C. per hour.

KB3-123-486, 530 nm peak, 39 nm FWHM. 0.562 g Eu, 0.416 g $Al_2S_3$, 0.522 g $Ga_2S_3$, 0.050 g S and 0.115 g $AlCl_3$ were ground and then divided into 4 quartz tubes sealed under vacuum. The tubes were heated together to 400° C. for one hour and then the temperature was increased to 900° C. and held for 6 hours. The furnace was cooled at 50° C. per hour. The tubes were opened under inert atmosphere and their contents ground together to combine them.

KB3-117-476a, 539 nm peak, 42 nm FWHM. 0.215 g Eu, 0.115 g $Al_2S_3$, 0.270 g $Ga_2S_3$, 0.020 g S and 0.045 g $AlCl_3$ were ground and then divided into 2 quartz tubes sealed under vacuum. One of the tubes was heated to 400° C. for one hour and then the temperature was increased to 900° C. and held for 6 hours. The furnace was cooled at 50° C. per hour.

KB3-080-430, 528 nm peak, 47 nm FWHM. 0.006 g Mg, 0.113 g SrS, 0.010 g Eu, 0.023 g Al, 0.198 g $Ga_2S_3$, and 0.071 g S were ground and put into a quartz tube and sealed under vacuum. The sample was heated together to 400° C. for 6 hours and then the temperature was increased to 800° C. and held for 12 hours. The furnace was cooled in 6 hours. The sample was opened under inert atmosphere, ground and sealed in a new quartz tube. It was heated to 950° C. for 24 hours and cooled to room temperature over 6 hours.

KB3-121-481, 533 nm peak, 44 nm FWHM. 0.117 g Eu, 0.048 g $Al_2S_3$, 0.114 g $Ga_2S_3$, 0.031 g S and 0.023 g $AlCl_3$ were ground and then sealed in a quartz tube under vacuum. The sample was heated to 400° C. for one hour and then the temperature was increased to 850° C. and held for 6 hours. The furnace was cooled at 25° C. per hour.

YBG170620-1, 521 nm peak, 41 nm FWHM. Stoichiometric amount of Eu, Al, $Ga_2S_3$ and 15 wt % excess S to form $Eu(Al_{1.85}Ga_{0.26})S_{4.37}$ were thoroughly ground in a mortar with a pestle in the glove box and sealed in a quartz tube under vacuum. The mixtures were placed in dried silica tubes, which were evacuated and sealed at a length of about 5 in. Reactions were carried out in box furnaces. The temperature was raised to 400° C. and held for 2 hours and raised again to 900° C. and held for 8-12 hours then cooled to room temperature for 6 hours.

ELTEAGS-012-B-2, 516 nm peak, 36 nm FWHM. The reagents CaS, Eu, Al and S were combined in stoichiometric amounts to obtain the nominal composition $CaAl_{2.7}S_{5.05}$: 8.5% Eu and loaded into an alumina crucible in a horizontal tube furnace. Following a 30-min purge with Ar, the mixture was heated to 400° C., at which point $H_2S$ gas flow was started. After 1 h at 400° C., the furnace was heated to 1000° C. for 2 h. Upon cooling, the $H_2S$ gas was turned off and the product was cooled to room temperature under flowing Ar.

ELTAlS-067-B, 516 nm peak, 35 nm FWHM. $Eu(Al_{1-x}Ga_x)_{2.7}S_{5.05+y}$ was prepared by combining Eu, $Al_2S_3$, $Ga_2S_3$ and S in stoichiometric ratios. 3 wt % $AlCl_3$ and 10 mg excess S were added prior to firing. The mixture was sealed in an evacuated silica tube and heated to 400° C. for 2 h, then heated to 850° C. for 6 h. The sample was cooled to room temperature at a rate of 50° C./h.

ELTAlS-073, 520 nm peak, 36 nm FWHM. CaS, Eu, Al and S were combined in stoichiometric amounts to obtain the nominal composition $CaAl_{2.7}S_{5.05}$:8.5% Eu. The mixture was homogenized in a mortar and pestle under Ar, then loaded into a carbon-coated silica tube which was subsequently evacuated and sealed under vacuum. Synthesis was carried out by a stepwise heating approach: 290° C. (17 h), 770° C. (24 h), 870° C. (24 h) and slow-cooled over 20 h. The product was recovered and manually reground before returning to a new carbon-coated silica tube and heated to 400° C. (6 h) and 1000° C. (3 h)

ELTEAGS-013-A-2, 520 nm peak, 40 nm FWHM. CaS, $EuF_3$, Al, $Ga_2S_3$ and S were combined stoichiometrically to obtain the target composition $CaAl_{2.565}Ga_{0.135}S_{5.05}$:%8.5Eu (5% Ga). The sample was homogenized under Ar then loaded into an alumina crucible and placed in a horizontal tube furnace. Following a 30-min purge with flowing Ar, the mixture was heated to 400° C., at which point $H_2S$ gas flow was started. After holding at 400° C. for 1 h, the sample was heated to 1000° C. for 2 h. The $H_2S$ gas was switched off at 800° C. during the cool down to room temperature over 2 h.

ELTEAGS-016-A-2, 522 nm peak, 39 nm FWHM. $CaAl_{2.43}Ga_{0.27}S_{5.05}$:8.5% Eu was prepared under flowing $H_2S/Ar$ from stoichiometric amounts of CaS, $EuF_3$, Al, $Ga_2S_3$ and S. The sample was homogenized in an Ar atmosphere then loaded into an alumina boat and placed in a horizontal tube furnace. Following a 1 h purge with flowing Ar, the mixture was heated to 400° C. for 1 h, at which point $H_2S$ gas flow was started. The sample was then heated to 1000° C. for 2 h and cooled to room temperature. The $H_2S$ gas was switched off at 800° C. during the cool down.

ELTAlS-035-G, 533 nm peak, 41 nm FWHM. $EuAlGaS_4$ was synthesized by combining Eu, $Al_2S_3$, $Ga_2S_3$ and S in stoichiometric amounts under Ar. The mixture was sealed in an evacuated quartz tube and heated to 400° C. (6 h) then to 800° C. (12 h). After grinding the product and adding 50 mg excess S, a second heat treatment was followed by heating to 400° C. (6 h) then to 1000° C. (6 h).

ELTAlS-069, 533 nm peak, 41 nm FWHM. Reagents Eu, Al$_2$S$_3$, Ga$_2$S$_3$ and S were combined stoichiometrically to prepare EuAl$_{1.35}$Ga$_{1.35}$S$_{5.05}$. Homogenization of the mixture was done in an Ar atmosphere in a mortar and pestle. 3 wt % AlCl$_3$ was used as a flux and the sample was sealed in an evacuated quartz tube. The reaction was done by heating the quartz ampoule to 400° C. (1 h) then to 900° C. (6 h). The product was recovered and manually ground with a mortar and pestle.

ELTAlS-036-F, 528 nm peak, 45 nm FWHM. EuAl$_{0.9}$Ga$_{1.1}$S$_4$ was synthesized from stoichiometric amounts of Eu, Al$_2$S$_3$, Ga metal, and S. The reactants were mixed under Ar then sealed in an evacuated quartz tube. Two heat treatments were followed to obtain the final product. Heat 1: 400° C. (12 h), 800° C. (12 h). Heat 2: 400° C. (12 h), 1000° C. (6 h). The sample was reground with 50 mg excess S and sealed in an evacuated quartz tube during the intermediate step.

ELTAlS-036-E, 534 nm peak, 45 nm FWHM. EuAl$_{0.8}$Ga$_{1.2}$S$_4$ was synthesized from stoichiometric amounts of Eu, Al$_2$S$_3$, Ga metal, and S. The reactants were mixed under Ar then sealed in an evacuated quartz tube. Two heat treatments were followed to obtain the final product. Heat 1: 400° C. (12 h), 800° C. (12 h). Heat 2: 400° C. (12 h), 1000° C. (6 h). The sample was reground with 50 mg excess S and sealed in an evacuated quartz tube during the intermediate step.

ELTAlS-042E & F, 536 nm peak, 45 nm FWHM. Eu(Al$_{0.4}$Ga$_{0.6}$)$_2$S$_4$ was synthesized from a pre-fired mixture of stoichiometric amounts of Eu, Al$_2$S$_3$, Ga$_2$S$_3$ and S. The product was combined with 0.12 g I$_2$ (15 wt %) and 0.16 g S (20 wt %) before separating into two portions and sealed into two evacuated quartz tubes. Both samples were heated to 950° C. (2 h) then quenched in either air or water.

ELTAlS-037-B, 550 nm peak, 51 nm FWHM. CaAl$_{0.675}$Ga$_{2.025}$S$_{5.05}$:8.5% Eu was synthesized by combining CaS, Eu, Al$_2$S$_3$, Ga$_2$S$_3$ and S in stoichiometric amounts. The mixture was homogenized using a mortar and pestle under Ar, then loaded into a carbon-coated silica tube which was subsequently evacuated and sealed under vacuum. Synthesis was carried out by a stepwise heating approach: 290° C. (17 h), 770° C. (24 h), 870° C. (24 h) and cooled to room temperature over 9 h. The product was recovered and manually reground with 50 mg S before adding to another carbon-coated silica tube and heated to 400° C. (6 h) and 1000° C. (3 h).

Phosphor slurries were created by combining Dow Corning OE-6550 2 part silicone, red phosphor, BR102/Q and a green phosphor, such as KB3-163-537. Phosphor converted LEDs were fabricated using portions of this slurry and applying them to 2835 PLCC packages from Power Opto Co.; the silicone was cured overnight at ca. 100° C.

Various embodiments are described in the following numbered clauses.

Clause 1. A light emitting device comprising:
a semiconductor light source emitting blue light;
a first phosphor arranged to be excited by the blue light emitted by the semiconductor light source and in response emit green light having a peak emission at from about 500 nm to about 550 nm with a full width at half maximum of about 30 nm to about 50 nm; and
a second phosphor arranged to be excited by the blue light emitted by the semiconductor light source and in response emit red light having a peak emission at a wavelength less than or equal to about 635 nm;
wherein an overall emission spectrum from the light emitting device has a depression between about 550 nm and about 580 nm, and the minimum intensity in the depression is greater than or equal to about 25% and less than or equal to about 75% of the maximum intensity in the overall emission spectrum in the range from about 400 nm to about 700 nm.

Clause 2. The light emitting device of clause 1 wherein the minimum in the overall emission spectrum from the light emitting device between about 550 nm and about 580 nm has a minimum intensity greater than or equal to about 30%, greater than or equal to about 35%, greater than or equal to about 40%, greater than or equal to about 45%, greater than or equal to about 50%, greater than or equal to about 55%, greater than or equal to about 60%, or greater than or equal to about 65% of the maximum intensity in the overall emission spectrum in the range from about 400 nm to about 700 nm.

Clause 3. The light emitting device of clause 1 or clause 2, wherein the blue light emitted by the semiconductor light source has a peak at from about 430 nm to about 465 nm and a full width at half maximum of about 10 nm to about 35 nm.

Clause 4. The light emitting device of any of clauses 1-3, wherein the green light emitted by the first phosphor has a full width at half maximum of less than or equal to about 45 nm, less than or equal to about 40 nm, or less than or equal to about 35 nm.

Clause 5. The light emitting device of any of clauses 1-4, wherein the red light emitted by the second phosphor has a full width at half maximum of about 70 nm to about 100 nm.

Clause 6. The light emitting device of any of clauses 1-5, wherein the overall emission spectrum from the light emitting device has an R9 color rendering value of greater than or equal to about 40, greater than or equal to about 50, greater than or equal to about 60, greater than or equal to about 70, greater than or equal to about 80, greater than or equal to about 90, or greater than or equal to about 95.

Clause 7. The light emitting device of any of clauses 1-6, wherein the overall emission spectrum from the light emitting device has a CRI greater than or equal to about 80, greater than or equal to about 85, greater than or equal to about 90, or greater than or equal to about 95.

Clause 8. The light emitting device of any of clauses 1-7, wherein the overall emission spectrum from the light emitting device has a luminous efficacy of radiation greater than or equal to about 280.

Clause 9. The light emitting device of any of clauses 1-8, wherein the overall emission spectrum from the light emitting device has an R9 color rendering value of greater than or equal to about 50 and a luminous efficacy of radiation greater than or equal to about 300.

Clause 10. The light emitting device of any of clauses 1-9, wherein the light emitting device does not comprise a phosphor emitting light having a peak emission greater than or equal to about 635 nm.

Clause 11. The light emitting device of clause 1, wherein:
the first phosphor emits green light having a peak emission at from about 500 nm to about 540 nm; and
the overall emission spectrum from the light emitting device has an R9 color rendering value of greater than or equal to about 40.

Clause 12. The light emitting device of clause 11, wherein the first phosphor emits green light having a peak emission at from about 520 nm to about 540 nm Clause 13. The light emitting device of clause 11 or clause 12 wherein the minimum in the overall emission spectrum from the light emitting device between about 550 nm and about 580 nm has a minimum intensity greater than or equal to about 30%, greater than or equal to about 35%, greater than or equal to about 40%, greater than or equal to about 45%, greater than or equal to about 50%, greater than or equal to about 55%, greater than or equal to about 60%, or greater than or equal to about 65% of the maximum intensity in the overall emission spectrum in the range from about 400 nm to about 700 nm.

Clause 14. The light emitting device of any of clauses 11-13, wherein the blue light emitted by the semiconductor light source has a peak at from about 430 nm to about 465 nm and a full width at half maximum of about 10 nm to about 35 nm.

Clause 15. The light emitting device of any of clauses 11-14, wherein the green light emitted by the first phosphor has a full width at half maximum of less than or equal to about 45 nm, less than or equal to about 40 nm, or less than or equal to about 35 nm.

Clause 16. The light emitting device of any of clauses 11-15, wherein the red light emitted by the second phosphor has a full width at half maximum of about 70 nm to about 100 nm.

Clause 17. The light emitting device of any of clauses 11-16, wherein the overall emission spectrum from the light emitting device has an R9 color rendering value of greater than or equal to about 50, greater than or equal to about 60, greater than or equal to about 70, greater than or equal to about 80, greater than or equal to about 90, or greater than or equal to about 95.

Clause 18. The light emitting device of any of clauses 11-17, wherein the overall emission spectrum from the light emitting device has a CRI greater than or equal to about 80, greater than or equal to about 85, greater than or equal to about 90, or greater than or equal to about 95.

Clause 19. The light emitting device of any of clauses 11-18, wherein the overall emission spectrum from the light emitting device has a luminous efficacy of radiation greater than or equal to about 280.

Clause 20. The light emitting device any of clauses 11-19, wherein the overall emission spectrum from the light emitting device has an R9 color rendering value of greater than or equal to about 50 and a luminous efficacy of radiation greater than or equal to about 300.

Clause 21. The light emitting device of any of clauses 11-20, wherein the light emitting device does not comprise a phosphor emitting light having a peak emission greater than or equal to about 635 nm.

Clause 22. The light emitting device of clause 1, wherein
the first phosphor emits green light having a peak emission at from about 500 nm to about 540 nm;
the second phosphor emits green light having a peak emission at less than or equal to about 620 nm; and
the overall emission spectrum from the light emitting device has an R9 color rendering value of greater than or equal to about 0.

Clause 23. The light emitting device of clause 22 wherein the minimum in the overall emission spectrum from the light emitting device between about 550 nm and about 580 nm has a minimum intensity greater than or equal to about 30%, greater than or equal to about 35%, greater than or equal to about 40%, greater than or equal to about 45%, greater than or equal to about 50%, greater than or equal to about 55%, greater than or equal to about 60%, or greater than or equal to about 65% of the maximum intensity in the overall emission spectrum in the range from about 400 nm to about 700 nm.

Clause 24. The light emitting device of clause 22 or clause 23, wherein the blue light emitted by the semiconductor light source has a peak at from about 430 nm to about 465 nm and a full width at half maximum of about 10 nm to about 35 nm.

Clause 25. The light emitting device of any of clauses 22-24, wherein the green light emitted by the first phosphor has a full width at half maximum of less than or equal to about 45 nm, less than or equal to about 40 nm, or less than or equal to about 35 nm.

Clause 26. The light emitting device of any of clauses 22-25, wherein the red light emitted by the second phosphor has a full width at half maximum of about 70 nm to about 100 nm.

Clause 27. The light emitting device of any of clauses 22-26, wherein the overall emission spectrum from the light emitting device has an R9 color rendering value of greater than or equal to about 10, greater than or equal to about 20, greater than or equal to about 30, greater than or equal to about 40, greater than or equal to about 50, greater than or equal to about 60, greater than or equal to about 70, greater than or equal to about 80, greater than or equal to about 90, or greater than or equal to about 95.

Clause 28. The light emitting device of any of clauses 22-27, wherein the overall emission spectrum from the light emitting device has a CRI greater than or equal to about 80, greater than or equal to about 85, greater than or equal to about 90, or greater than or equal to about 95.

Clause 29. The light emitting device of any of clauses 22-28, wherein the overall emission spectrum from the light emitting device has a luminous efficacy of radiation greater than or equal to about 280.

Clause 30. The light emitting device any of clauses 22-29, wherein the overall emission spectrum from the light emitting device has an R9 color rendering value of greater than or equal to about 50 and a luminous efficacy of radiation greater than or equal to about 300.

Clause 31. The light emitting device of any of clauses 22-30, wherein the light emitting device does not comprise a phosphor emitting light having a peak emission greater than or equal to about 635 nm.

Clause 32. The light emitting device of any of clauses 1-31, wherein the first phosphor does not comprise quantum dots, or the second phosphor does not comprise quantum dots, or the first phosphor does not comprise quantum dots and the second phosphor does not comprise quantum dots.

Clause 33. The light emitting device of any of clauses 1-31, wherein the first phosphor comprises quantum dots, or the second phosphor comprises quantum dots, or the first phosphor and the second phosphor comprise quantum dots.

Clause 34. The light emitting device of any of clauses 1-31, wherein the first phosphor is disposed directly on the semiconductor light source.

Clause 35. The light emitting device of any of clauses 1-34, wherein the light emitting device does not comprise a filter producing a depression between about 550 nm and about 580 nm or about 590 nm.

This disclosure is illustrative and not limiting. Further modifications will be apparent to one skilled in the art in light of this disclosure and are intended to fall within the scope of the appended claims. For example, light emitting devices as described herein may optionally comprise quantum dots emitting in green or red portions of the visible spectrum. Quantum dots that may be suitable for such use include, for example, quantum dots having cadmium selenide cores with cadmium sulfide and zinc sulfide shells and quantum dots having indium phosphide cores with zinc sulfide shells. The emission peak wavelength is determined primarily by the size of the quantum dot. For cadmium selenide, a diameter of about 2.5 nanometers results in green emission, while a dimeter of about 6 nm results in red emission (see for example http://www.nn-labs.com/wp-content/uploads/2017/06/CSE-Tech-Specs.pdf). For indium phosphide, a diameter of about 7 nm results in a green emitting quantum dot, while a diameter of about 15 nm results in a red emitting quantum dot (see for example Journal of Nanomaterials Volume 2012, Article ID 869284, 11 pages doi:10.1155/2012/869284).

What is claimed is:

1. A light emitting device comprising:
   a semiconductor light source emitting blue light;
   a first phosphor arranged to be excited by the blue light emitted by the semiconductor light source and in response emit green light having a peak emission at from about 500 nm to about 550 nm with a full width at half maximum of about 30 nm to about 50 nm; and
   a second phosphor arranged to be excited by the blue light emitted by the semiconductor light source and in response emit red light having a peak emission at a wavelength less than or equal to about 635 nm;
   wherein an overall emission spectrum from the light emitting device has a depression between about 550 nm and about 580 nm, and the minimum intensity in the depression is greater than or equal to about 25% and less than or equal to about 75% of the maximum intensity in the overall emission spectrum in the range from about 400 nm to about 700 nm.

2. The light emitting device of claim 1, wherein the blue light emitted by the semiconductor light source has a peak at from about 430 nm to about 465 nm and a full width at half maximum of about 10 nm to about 35 nm.

3. The light emitting device of claim 1, wherein the green light emitted by the first phosphor has a full width at half maximum of less than or equal to about 45 nm.

4. The light emitting device of claim 1, wherein the red light emitted by the second phosphor has a full width at half maximum of about 70 nm to about 100 nm.

5. The light emitting device of claim 1, wherein the overall emission spectrum from the light emitting device has an R9 color rendering value of greater than or equal to about 40.

6. The light emitting device of claim 1, wherein the overall emission spectrum from the light emitting device has a CRI greater than or equal to about 80.

7. The light emitting device of claim 1, wherein the overall emission spectrum from the light emitting device has a luminous efficacy of radiation greater than or equal to about 280.

8. The light emitting device of claim 1, wherein the overall emission spectrum from the light emitting device has an R9 color rendering value of greater than or equal to about 50 and a luminous efficacy of radiation greater than or equal to about 300.

9. The light emitting device of claim 1, wherein the light emitting device does not comprise a phosphor emitting light having a peak emission greater than or equal to about 635 nm.

10. The light emitting device of claim 1, wherein:
    the first phosphor emits green light having a peak emission at from about 500 nm to about 540 nm; and
    the overall emission spectrum from the light emitting device has an R9 color rendering value of greater than or equal to about 40.

11. The light emitting device of claim 10, wherein the first phosphor emits green light having a peak emission at from about 520 nm to about 540 nm.

12. The light emitting device of claim 10, wherein the blue light emitted by the semiconductor light source has a peak at from about 430 nm to about 465 nm and a full width at half maximum of about 10 nm to about 35 nm.

13. The light emitting device of claim 10, wherein the green light emitted by the first phosphor has a full width at half maximum of less than or equal to about 45 nm.

14. The light emitting device of claim 10, wherein the red light emitted by the second phosphor has a full width at half maximum of about 70 nm to about 100 nm.

15. The light emitting device of claim 10, wherein the overall emission spectrum from the light emitting device has a CRI greater than or equal to about 80.

16. The light emitting device of claim 10, wherein the overall emission spectrum from the light emitting device has a luminous efficacy of radiation greater than or equal to about 280.

17. The light emitting device of claim 10, wherein the overall emission spectrum from the light emitting device has an R9 color rendering value of greater than or equal to about 50 and a luminous efficacy of radiation greater than or equal to about 300.

18. The light emitting device of claim 10, wherein the light emitting device does not comprise a phosphor emitting light having a peak emission greater than or equal to about 635 nm.

19. The light emitting device of claim 1, wherein
    the first phosphor emits green light having a peak emission at from about 500 nm to about 540 nm;
    the second phosphor emits green light having a peak emission at less than or equal to about 620 nm; and
    the overall emission spectrum from the light emitting device has an R9 color rendering value of greater than or equal to about 0.

20. The light emitting device of claim 19, wherein the blue light emitted by the semiconductor light source has a peak at from about 430 nm to about 465 nm and a full width at half maximum of about 10 nm to about 35 nm.

21. The light emitting device of claim 19, wherein the green light emitted by the first phosphor has a full width at half maximum of less than or equal to about 45 nm.

22. The light emitting device of claim 19, wherein the red light emitted by the second phosphor has a full width at half maximum of about 70 nm to about 100 nm.

23. The light emitting device of claim 19, wherein the overall emission spectrum from the light emitting device has a CRI greater than or equal to about 80.

24. The light emitting device of claim 19, wherein the overall emission spectrum from the light emitting device has a luminous efficacy of radiation greater than or equal to about 280.

25. The light emitting device of claim 19, wherein the overall emission spectrum from the light emitting device has an R9 color rendering value of greater than or equal to about 50 and a luminous efficacy of radiation greater than or equal to about 300.

26. The light emitting device of claim 19, wherein the light emitting device does not comprise a phosphor emitting light having a peak emission greater than or equal to about 635 nm.

27. The light emitting device of claim 1, wherein the first phosphor does not comprise quantum dots.

28. The light emitting device of claim 1, wherein the first phosphor comprises quantum dots.

29. The light emitting device of claim 1, wherein the first phosphor is disposed directly on the semiconductor light source.

30. The light emitting device of any of claim 1, wherein the light emitting device does not comprise a filter producing a depression between about 550 nm and about 590 nm.

* * * * *